(12) United States Patent
Bauer et al.

(10) Patent No.: US 7,196,836 B2
(45) Date of Patent: Mar. 27, 2007

(54) REARVIEW ASSEMBLY HAVING AN INTEGRAL CRUSH ZONE

(75) Inventors: Frederick T. Bauer, Holland, MI (US); Daniel J. Bostwick, Grandville, MI (US); Wayne J. Rumsey, Holland, MI (US); Robert R. Turnbull, Holland, MI (US); Alan R. Watson, Buchanan, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

(21) Appl. No.: 10/985,857

(22) Filed: Nov. 10, 2004

(65) Prior Publication Data

US 2005/0270621 A1    Dec. 8, 2005

Related U.S. Application Data

(63) Continuation-in-part of application No. 10/863,638, filed on Jun. 8, 2004.

(51) Int. Cl.
    *G02F 1/15* (2006.01)

(52) U.S. Cl. ....................................................... 359/265

(58) Field of Classification Search ......... 359/265–275
    See application file for complete search history.

(56) References Cited

U.S. PATENT DOCUMENTS

| 1,096,452 A | 5/1914 | Perrin |
| 1,563,258 A | 11/1925 | Cunningham |
| 2,457,348 A | 12/1948 | Chambers |
| 2,561,582 A | 7/1951 | Marbel |
| 4,274,078 A | 6/1981 | Isobe et al. |
| 4,733,335 A | 3/1988 | Serizawa et al. |
| 4,803,599 A | 2/1989 | Trine et al. |
| 5,014,167 A | 5/1991 | Roberts |
| 5,016,996 A | 5/1991 | Ueno |
| 5,017,903 A | 5/1991 | Krippelz, Sr. |
| 5,059,015 A | 10/1991 | Tran |
| 5,151,824 A | 9/1992 | O'Farrell et al. |
| 5,207,492 A | 5/1993 | Roberts |
| 5,313,335 A | 5/1994 | Gray et al. |
| 5,355,284 A | 10/1994 | Roberts |
| 5,361,190 A | 11/1994 | Roberts et al. |
| 5,371,659 A | 12/1994 | Pastrick et al. |
| 5,402,103 A | 3/1995 | Tashiro |

(Continued)

FOREIGN PATENT DOCUMENTS

CA          2028461         11/1994

(Continued)

OTHER PUBLICATIONS

Roberts, John K., "Dichroic Mirrors with Semi-active Covert Displays," Interior & Exterior Systems, International Body Engineering Conf. Sep. 21-23, 1993, pp. 65-69.

*Primary Examiner*—Huy Mai
*Assistant Examiner*—Tuyen Tra
(74) *Attorney, Agent, or Firm*—Price, Heneveld, Cooper, DeWitt & Litton, LLP

(57) ABSTRACT

A rearview assembly comprising a rearview element, a rearview element support assembly supporting the rearview element and a mount adjacent the housing. The mount is configured to connect the rearview assembly to a windshield. At least one of the rearview element support assembly and the mount comprises a crush bracket having at least two legs adapted to be compressed as a force strikes a front of the rearview element. The crush bracket can include at least one tab contacting a heat emitting component and/or an electrically conductive component of a circuit to provide a heat sink for the heat emitting component or a ground for the electrically conductive component, respectively.

92 Claims, 18 Drawing Sheets

U.S. PATENT DOCUMENTS

| | | |
|---|---|---|
| 5,436,741 A | 7/1995 | Crandall |
| D363,920 S | 11/1995 | Roberts et al. |
| 5,481,409 A | 1/1996 | Roberts |
| 5,497,305 A | 3/1996 | Pastrick et al. |
| 5,497,306 A | 3/1996 | Pastrick |
| 5,520,063 A * | 5/1996 | Santo .................... 74/97.1 |
| 5,528,422 A | 6/1996 | Roberts |
| 5,587,699 A | 12/1996 | Faloon et al. |
| 5,619,374 A | 4/1997 | Roberts |
| 5,619,375 A | 4/1997 | Roberts |
| 5,632,551 A | 5/1997 | Roney et al. |
| 5,669,699 A | 9/1997 | Pastrick et al. |
| 5,669,704 A | 9/1997 | Pastrick |
| 5,669,705 A | 9/1997 | Pastrick et al. |
| D394,833 S | 6/1998 | Muth |
| 5,788,357 A | 8/1998 | Muth et al. |
| 5,796,176 A | 8/1998 | Kramer et al. |
| 5,798,575 A | 8/1998 | O'Farrell et al. |
| 5,818,625 A | 10/1998 | Forgette et al. |
| 5,823,654 A | 10/1998 | Pastrick et al. |
| 5,825,527 A | 10/1998 | Forgette et al. |
| 5,863,116 A | 1/1999 | Pastrick et al. |
| 5,879,074 A | 3/1999 | Pastrick |
| D409,540 S | 5/1999 | Muth |
| 5,938,320 A | 8/1999 | Crandall |
| 5,959,367 A | 9/1999 | O'Farrell et al. |
| 6,005,724 A | 12/1999 | Todd |
| 6,007,222 A | 12/1999 | Thau |
| 6,045,243 A | 4/2000 | Muth et al. |
| D425,466 S | 5/2000 | Todd et al. |
| 6,062,920 A | 5/2000 | Jordan et al. |
| 6,064,508 A | 5/2000 | Forgette et al. |
| D426,506 S | 6/2000 | Todd et al. |
| D426,507 S | 6/2000 | Todd et al. |
| D427,128 S | 6/2000 | Mathieu |
| 6,074,077 A | 6/2000 | Pastrick et al. |
| 6,076,948 A | 6/2000 | Bukosky et al. |
| D428,372 S | 7/2000 | Todd et al. |
| D428,373 S | 7/2000 | Todd et al. |
| 6,086,229 A | 7/2000 | Pastrick |
| 6,093,976 A | 7/2000 | Kramer et al. |
| D428,842 S | 8/2000 | Todd et al. |
| D429,202 S | 8/2000 | Todd et al. |
| D430,088 S | 8/2000 | Todd et al. |
| 6,099,155 A | 8/2000 | Pastrick et al. |
| 6,111,683 A | 8/2000 | Cammenga et al. |
| 6,111,684 A | 8/2000 | Forgette et al. |
| 6,124,886 A | 9/2000 | DeLine et al. |
| 6,142,656 A | 11/2000 | Kurth |
| 6,146,003 A | 11/2000 | Thau |
| 6,149,287 A | 11/2000 | Pastrick et al. |
| 6,152,590 A | 11/2000 | Furst et al. |
| 6,163,083 A | 12/2000 | Kramer et al. |
| 6,166,848 A | 12/2000 | Cammenga et al. |
| 6,170,956 B1 | 1/2001 | Rumsey et al. |
| 6,175,164 B1 | 1/2001 | O'Farrell et al. |
| 6,176,602 B1 | 1/2001 | Pastrick et al. |
| 6,195,194 B1 | 2/2001 | Roberts et al. |
| 6,206,553 B1 | 3/2001 | Boddy et al. |
| 6,227,689 B1 | 5/2001 | Miller |
| 6,244,716 B1 | 6/2001 | Steenwyk et al. |
| 6,257,746 B1 | 7/2001 | Todd et al. |
| 6,264,353 B1 | 7/2001 | Carraher et al. |
| 6,276,821 B1 | 8/2001 | Pastrick et al. |
| 6,280,069 B1 | 8/2001 | Pastrick et al. |
| 6,296,379 B1 | 10/2001 | Pastrick |
| 6,299,333 B1 | 10/2001 | Pastrick et al. |
| 6,336,737 B1 | 1/2002 | Thau |
| 6,340,849 B1 | 1/2002 | Kramer et al. |
| 6,340,850 B2 | 1/2002 | O'Farrell et al. |
| 6,347,880 B1 | 2/2002 | Furst et al. |
| 6,356,376 B1 | 3/2002 | Tonar et al. |
| 6,379,013 B1 | 4/2002 | Bechtel et al. |
| 6,416,208 B2 | 7/2002 | Pastrick et al. |
| 6,420,800 B1 | 7/2002 | LeVesque et al. |
| 6,426,568 B2 | 7/2002 | Turnbull et al. |
| 6,441,943 B1 | 8/2002 | Roberts et al. |
| 6,471,362 B1 | 10/2002 | Carter et al. |
| 6,614,579 B2 | 9/2003 | Roberts et al. |
| 6,621,616 B1 | 9/2003 | Bauer et al. |
| 6,650,457 B2 | 11/2003 | Busscher et al. |
| 6,657,767 B2 * | 12/2003 | Bonardi et al. ............ 359/265 |
| 6,679,608 B2 | 1/2004 | Bechtel et al. |
| 6,700,692 B2 | 3/2004 | Tonar et al. |
| 6,737,629 B2 | 5/2004 | Nixon et al. |
| 6,755,542 B2 | 6/2004 | Bechtel et al. |
| 6,805,474 B2 | 10/2004 | Walser et al. |
| 6,831,268 B2 | 12/2004 | Bechtel et al. |
| 2002/0126497 A1 | 9/2002 | Pastrick |
| 2004/0061920 A1 | 4/2004 | Tonar et al. |
| 2005/0174622 A1 | 8/2005 | Lawlor et al. |

FOREIGN PATENT DOCUMENTS

| | | |
|---|---|---|
| EP | 0240226 A2 | 10/1987 |
| EP | 0450162 | 12/1990 |
| EP | 0531143 A2 | 3/1993 |
| GB | 2161440 | 1/1986 |
| WO | WO 9530495 A1 | 11/1995 |
| WO | WO 9940039 | 8/1999 |
| WO | WO 0030893 | 6/2000 |
| WO | WO 2003/095269 A3 | 4/2003 |
| WO | WO03095269 | 11/2003 |
| WO | WO 03/099614 A1 | 12/2003 |
| WO | WO 03103338 A2 | 12/2003 |

* cited by examiner

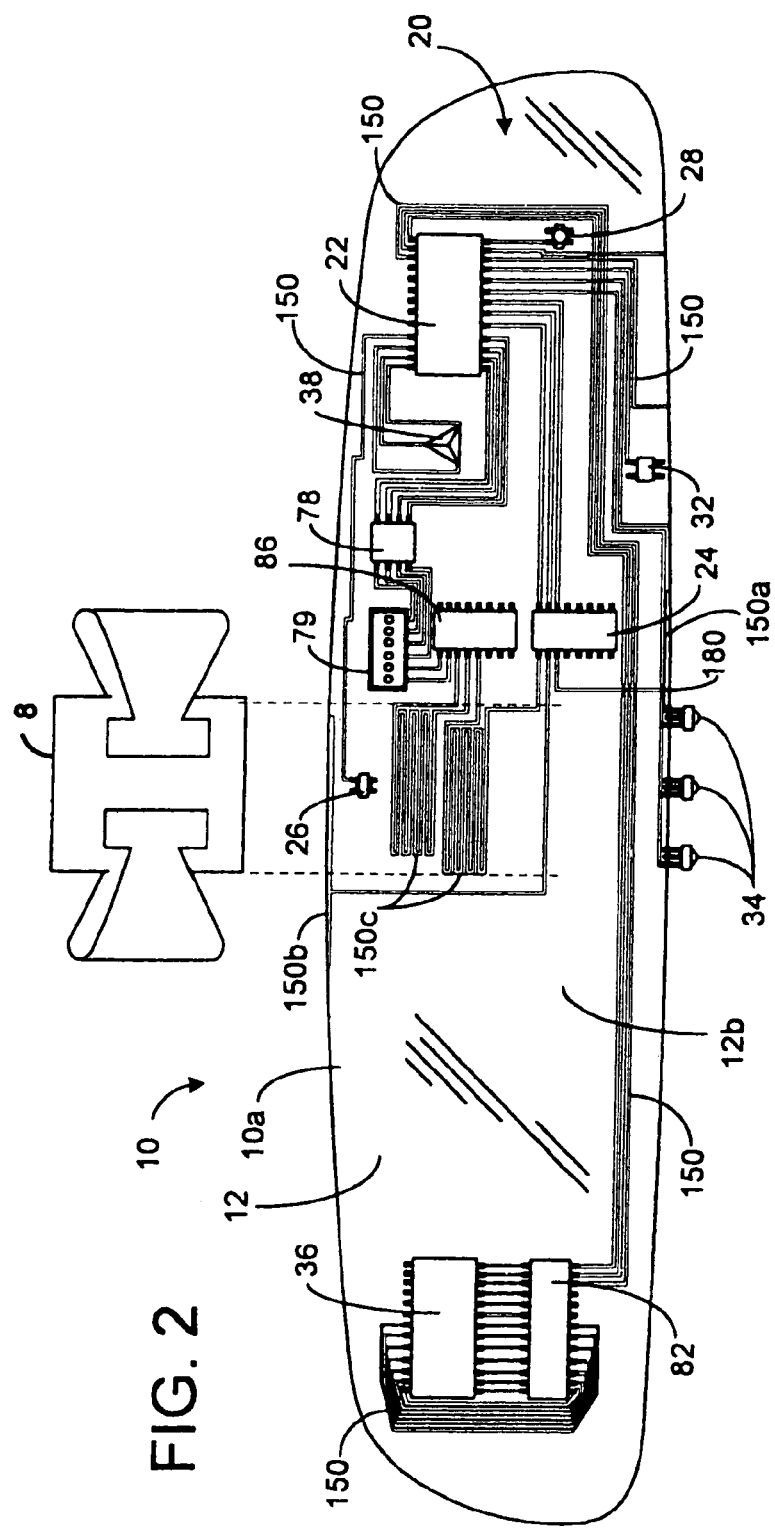

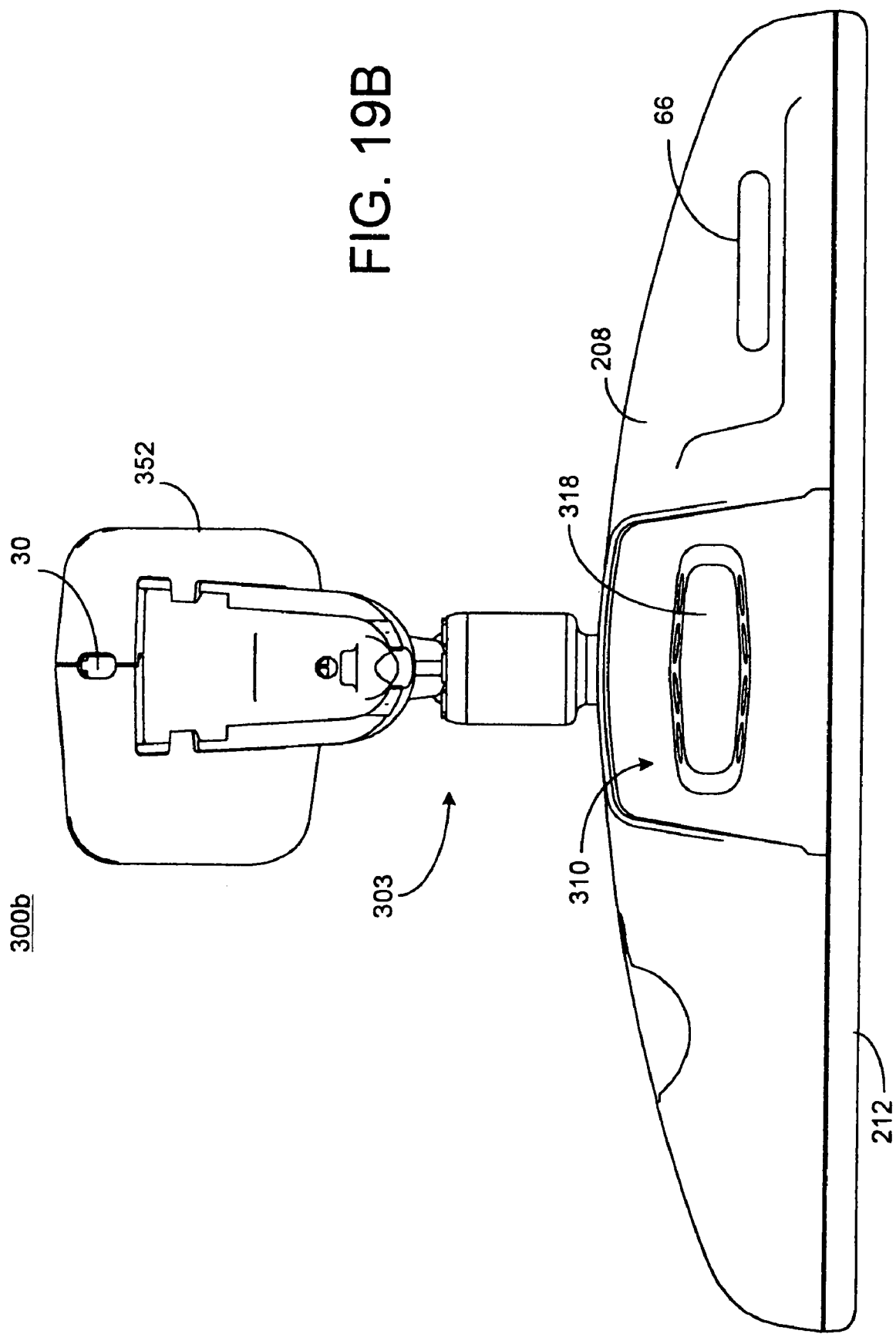

REARVIEW ASSEMBLY HAVING AN INTEGRAL CRUSH ZONE

CROSS-REFERENCE TO RELATED APPLICATION

This application is a continuation-in-part of U.S. patent application Ser. No. 10/863,638 which was filed on Jun. 8, 2004 and entitled "REARVIEW MIRROR ELEMENT HAVING A CIRCUIT MOUNTED TO THE REAR SURFACE OF THE ELEMENT."

BACKGROUND

The present invention concerns vehicle mirrors, and more particularly relates to a rearview assembly having an integral crush zone.

Interior and exterior rearview mirrors of modern passenger vehicles have become heavier and heavier as more and more content and features are added. For example, many modern vehicle mirrors include several of the following options: electrochromic mirror subassemblies and circuitry to reduce glare, keyless entry sensing systems, microphone-speaker-antennae-phone communication systems, audio-control systems, compass and temperature devices and displays, lighting, switches for control of electrical circuits, and the like. Since most vehicle mirrors are supported from one side (usually a back or top side), this added weight creates a pendulum effect that causes the mirrors to shake, vibrate, and resonate unacceptably. In order to reduce the shaking, vibration, and resonation, the rear support area on most rearview mirrors is beefed up to increase rigidity and stability, and/or reinforcement ribs are added to the rear support area. However, any increase in wall thickness and/or increase in the number of reinforcement ribs adds to part weight, adds to sinks and blemishes and other quality problems when molding the parts, and adds to part complexity. Further, the added ribs take up substantial space, making a profile of the mirrors much larger. It is desirable to provide a mirror design where the number of reinforcement ribs and webs in a mirror housing are minimized or eliminated, and where the mirror housing is primarily designed as a cosmetic covering rather than a structural member. It is noted that vehicle manufacturers have high visual standards for the housings of interior rearview mirrors, since vehicle passengers not only look at and touch the mirror housings often, but also the mirrors are in a position where every blemish and defect is easily seen.

Modern interior rearview mirrors are typically mounted from their hidden backside by an elongated mount, and are made to be angularly adjustable by a ball-and-socket connector that connects the mirror to the mount. This allows each vehicle driver to angularly adjust the mirror to an optimal position and preference. The adjustable connector is made sufficiently rigid to hold the mirror in a selected angular position, even when receiving substantial vibrational stress. However, the adjustable connectors include a plurality of separate parts and pieces that requires assembly, and further takes up space. It would be desirable to provide a mount where the ball-and-socket connection was better integrated into one of the mirror components.

Still another concern is wire management. Modern vehicle mirrors can have several wires connected to internal components within the mirror head. These wires need to be managed so that they do not become entangled or pinched during assembly or during angular adjustment. Further, mispositioning of wires can cause substantial variation in electromagnetic interference and radio frequency interference emitted from power-using electrical components on the mirror, which is of increasing concern to vehicle manufacturers. It is desirable to provide a mirror having an integrated wire management system so that wires are well managed and consistently located in the mirror, and so that the wires are integrally shielded along with the electrical devices to which they are connected.

Another concern is impact-testing and vehicle safety. For example, at least one vehicle manufacturer requires that the mirror glass not break or result in separation of large glass pieces from the mirror, particularly where the glass pieces are more than 2.5 mm from a crack line, since loose broken glass can be injurious to a vehicle driver or passenger. Hence, it is important that glass elements be supported in a manner that minimizes a tendency of the glass to be sharply bent and broken upon impact, and that holds the glass elements in a manner which keeps broken pieces from coming loose upon impact. This problem can be complicated in an electrochromic (EC) mirror since an EC mirror has two glass elements with an EC material therebetween.

In addition to the above problems, as mirrors have become increasingly complex and sophisticated, the number of parts and pieces necessary for assembly has increased. It is desirable to provide an improvement where the many parts and pieces can be assembled in a more open physical arrangement, rather than having to be assembled into the cavity of a concave mirror housing. It is also potentially preferable that the mirror housing be designed more for "pure aesthetics," such that functional aspects are not as much of a concern.

Accordingly, an apparatus is desired having the aforementioned advantages and solving and/or making improvements on the aforementioned disadvantages.

SUMMARY OF THE PRESENT INVENTION

An aspect of the present invention is to provide a rearview assembly comprising a rearview element, a crush bracket and a mount. The rearview element has a front surface and a rear surface. The crush bracket is connected to the rear surface of the rearview element. The crush bracket includes a support panel directly connected to the rear surface of the rearview element and at least two legs extend from the support panel in a direction opposite the rearview element. The mount is interconnected to the at least two legs of the crush bracket. The at least two legs are configured to collapse in a direction between the rear surface of the rearview element and the mount as a striking force strikes the front surface of the rearview element.

Another aspect of the present invention is to provide a rearview assembly comprising a rearview element, a crush bracket and a mount. The rearview element has a front surface and a rear surface. The rearview element has a portion of a circuit provided directly on the rear surface. The crush bracket is connected to the rear surface of the rearview element, with the crush bracket including at least two legs. The mount is interconnected to the at least two legs of the crush bracket. The at least two legs are configured to collapse in a direction between the rear surface of the rearview element and the mount as a striking force strikes the front surface of the rearview element.

Yet another aspect of the present invention is to provide a rearview assembly comprising a rearview element, a support plate, a crush bracket and a mount. The rearview element has a front surface and a rear surface. The support plate supports the rearview element. The crush bracket includes a support panel connected to the support plate and at least two legs extending from the support panel. The mount is interconnected to the at least two legs of the crush bracket. The at least two legs are configured to collapse in a direction between the rear surface of the rearview element and the mount as a striking force strikes the front surface of the rearview element.

A further aspect of the present invention is to provide a rearview assembly comprising a rearview element, a rearview element support assembly and a mount. The rearview element support assembly supports the rearview element. The mount is configured to connect the rearview assembly to a windshield. At least one of the rearview element support assembly and the mount comprises a crush bracket having at least two legs adapted to be compressed as a force strikes a front of the rearview element.

Another aspect of the present invention is to provide a rearview assembly comprising a rearview element, a housing, an electrical circuit in the housing and a crush bracket. The housing has the rearview element therein. The electrical circuit includes a heat emitting component. The crush bracket is interconnected to the rearview element and includes at least a portion thereof contacting the heat emitting component to provide a heat sink for the heat emitting component.

Yet another aspect of the present invention is to provide a rearview assembly comprising a rearview element, a housing, an electrical circuit in the housing and a crush bracket. The housing has the rearview element therein. The electrical circuit includes an electrically conductive component. The crush bracket is interconnected to the rearview element and includes at least a portion thereof contacting the electrically conductive component to provide a ground for the electrically conductive component.

A further aspect of the present invention is to provide a rearview assembly for a vehicle comprising a rearview element having a front surface, a rearview element housing having at least a portion of the rearview element therein and a mount for connecting the rearview element and the rearview element housing to a windshield of the vehicle. A portion of the rearview assembly non-elastically compresses at least 1.0 mm without breaking the rearview element as the reflective surface of the rearview element is subjected to a force no greater than 400 N (90 pounds) in any direction that is not more than 45° from a forward longitudinal direction of motion of the vehicle.

Another aspect of the present invention is to provide a rearview assembly comprising a rearview element, a support bracket supporting the rearview element, a rearview element housing and a mount connected to the support bracket. The rearview element is not maintained in position with the rearview element housing by the rearview element housing.

Yet another aspect of the present invention is to provide a method of assembling a rearview assembly comprising a rearview element, a support bracket, a rearview element housing with an opening, and a mount. The method further includes connecting the support bracket and the rearview element together. The method also includes connecting the mount to the support bracket and sliding the rearview element housing over a portion of the support bracket and the rearview element, with the portion of the support bracket and the mount sliding through the opening.

These and other aspects, objects, and features of the present invention will be understood and appreciated by those skilled in the art upon studying the following specification, claims, and appended drawings.

BRIEF DESCRIPTION OF DRAWINGS

FIG. 2 is an elevational view of the rear of a rearview element constructed in accordance with the present invention.

FIG. 6 is a cross-sectional view of a portion of the rearview element of the present invention.

FIG. 7 is a cross-sectional view of a portion of the rearview element of the present invention.

FIG. 19B is a plan view of the top of the rearview assembly shown in FIG. 19A.

DETAILED DESCRIPTION OF PREFERRED EMBODIMENTS

Figure 1:
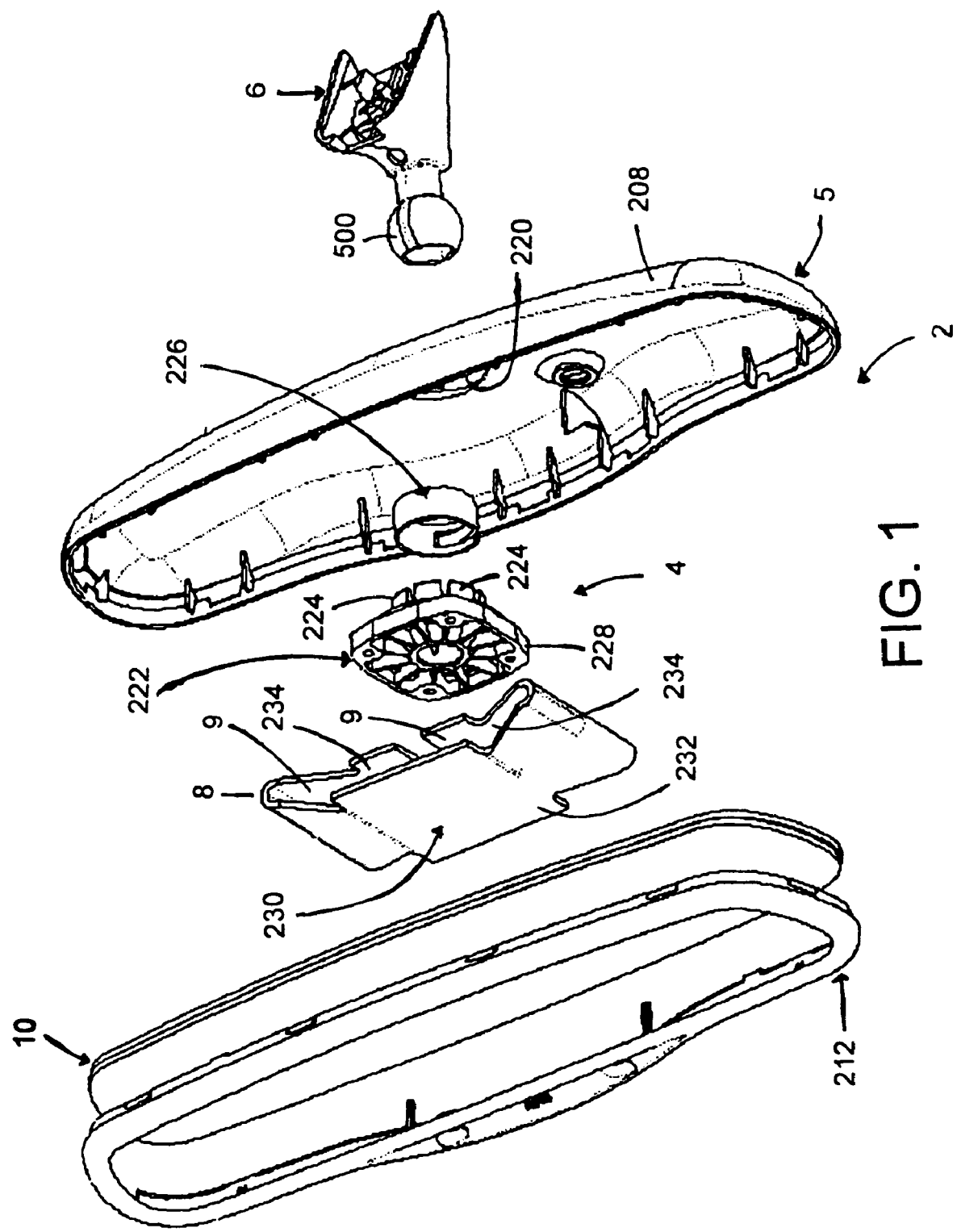
FIG. 1 is an exploded perspective view of a rearview assembly in accordance with the present invention.

Reference will now be made in detail to the present preferred embodiments of the invention, examples of which are illustrated in the accompanying drawings. Wherever possible, the same reference numerals will be used throughout the drawings to refer to the same or like parts.

Figure 8:
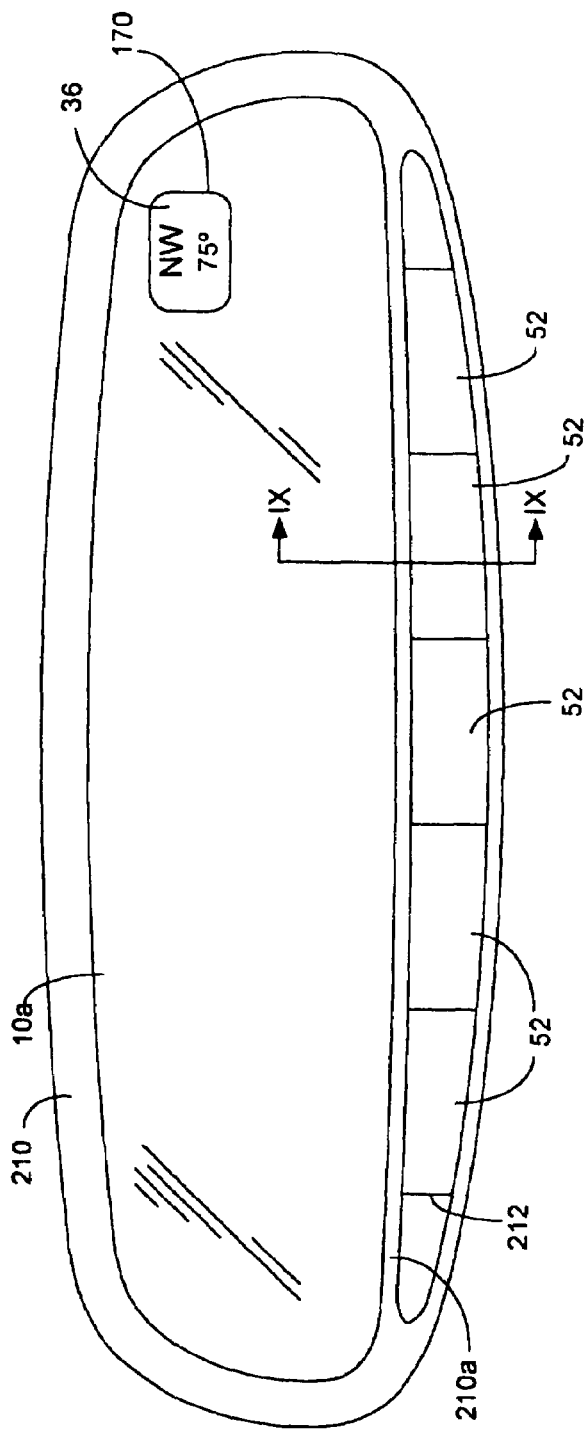
FIG. 8 is an elevational view of the front of a rearview assembly constructed in accordance with the present invention.

For purposes of description herein, the terms "upper," "lower," "right," "left," "rear," "front," "vertical," "horizontal," "top," "bottom," and derivatives thereof shall relate to the invention as viewed in FIG. 8, which will be that of a driver's perspective seated in a driver position. However, it is to be understood that the invention may assume various alternative orientations, except where expressly specified to the contrary. It is also to be understood that the specific device illustrated in the attached drawings and described in the following specification is simply an exemplary embodiment of the inventive concepts defined in the appended claims. Hence, specific dimensions, proportions, and other physical characteristics relating to the embodiment disclosed herein are not to be considered as limiting, unless the claims expressly state otherwise.

The reference number 2 (FIG. 1) generally designates a first embodiment of a rearview assembly for a vehicle embodying the present invention. The rearview assembly 2 comprises a rearview element 10, a housing comprising a rear housing member 208 and a bezel 212, a rearview element support assembly 4 supporting the rearview element 10 in the housing and a mount 6. The mount 6 is configured to connect the rearview assembly 2 to a windshield. At least one of the rearview element support assembly 4 and the mount 6 comprises a crush bracket 8 having at least two legs 9 adapted to be compressed as a force strikes a front of the rearview element 10.

The Rearview Element

In a first illustrated embodiment, the rearview element 10 (FIGS. 2 and 3A) of the present invention comprises a reflective element including a first substrate 12 having a front surface 12a and a rear surface 12b, a reflective coating 15 disposed on one of the front surface 12a or the rear surface 12b of the first substrate 12, and circuitry 20 comprising one or more electronic circuit components (21–116) secured to the rear surface 12b of the first substrate 12.

Figure 3A:
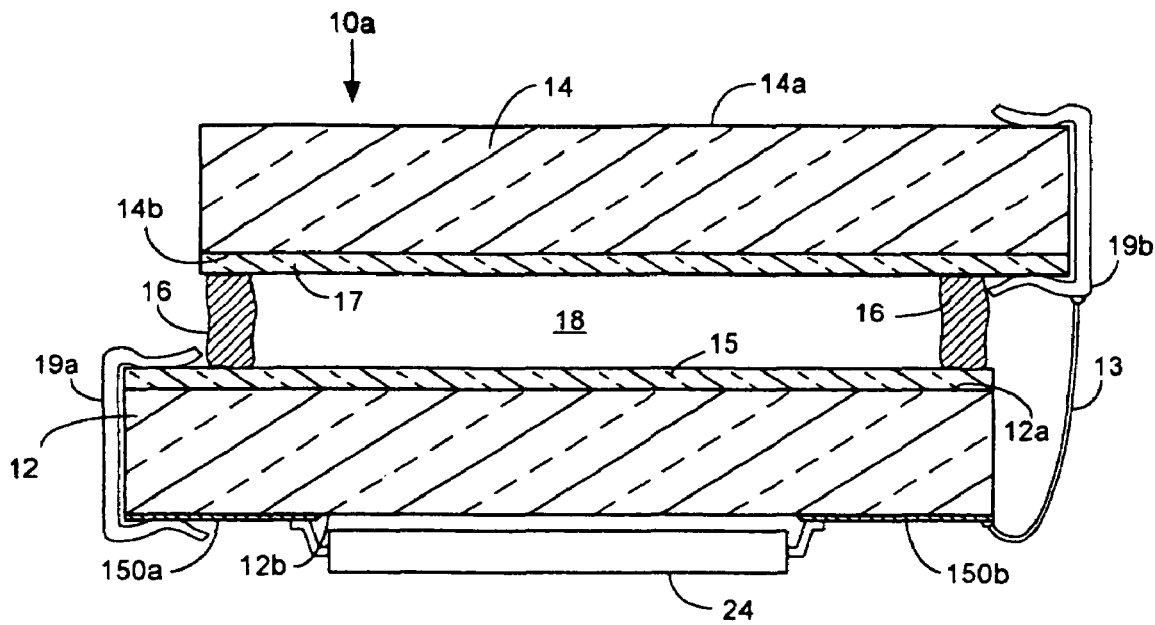
FIG. 3A is a cross-sectional view of a portion of the rearview element constructed in accordance with a first embodiment of the rearview element of the present invention.

The illustrated rearview element 10 may be electrochromic reflective element 10a. As shown in FIG. 3A, the electrochromic reflective element 10a further includes a transparent second substrate 14 positioned in front of the first substrate 12. The reflective coating 15 is preferably applied to the front surface 12a of the first substrate 12. The reflective coating 15 is, thus preferably electrically conductive to serve as a first electrode for the electrochromic reflective element 10a. The electrochromic reflective element 10a further comprises a transparent conductive layer 17 applied to a rear surface 14b of the second substrate 14, which serves as a second electrode.

As also illustrated in FIG. 3A, the electrochromic reflective element 10a further includes a seal 16 extending between the first substrate 12 and the second substrate 14 proximate the edges thereof to form a sealed chamber in which an electrochromic medium 18 is contained. The electrochromic medium 18 is in electrical contact with the transparent conductive layer 17 and the reflective coating 15. In the illustrated embodiment, the reflective coating 15 is applied to the rear surface 12b of the first substrate 12. However, in an alternative embodiment, the reflective coating 15 may be applied to the rear surface 12b of the first substrate 12, and a second transparent conductive layer may be applied to the front surface 12a of the first substrate 12 to serve as the first electrode as known in the art. During operation, electrical current may be passed through the electrochromic medium 18 via the electrodes (the reflective coating 15 and the transparent conductive layer 17), thereby causing the electrochromic medium 18 to darken. When the electrochromic medium 18 darkens, the reflectivity of the electrochromic reflective element 10a is reduced, thereby reducing glare reflected from the electrochromic reflective element 10a towards the eyes of a driver. Additional details of the electrochromic reflective element 10a are described further below.

Figure 4:
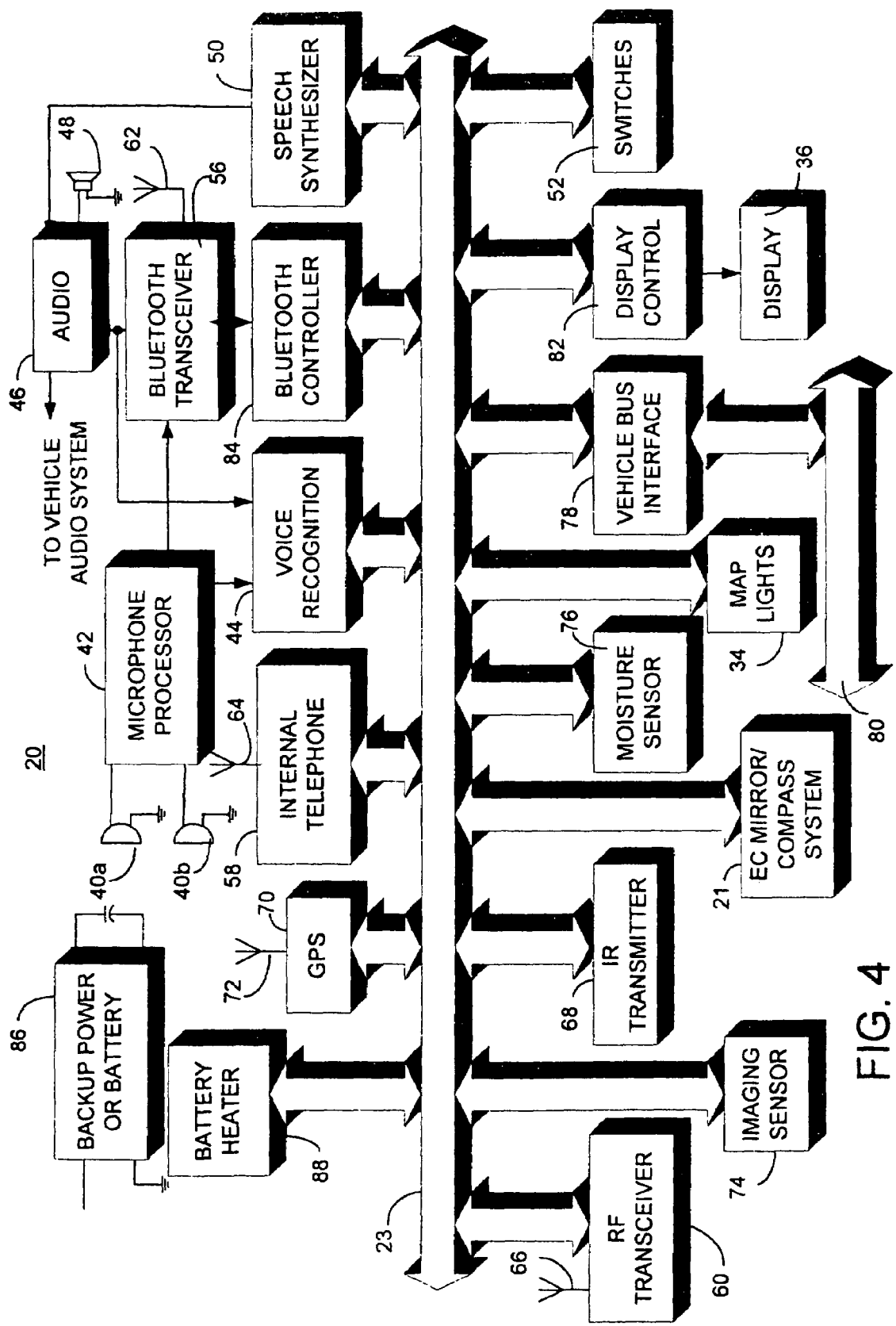
FIG. 4 is an electrical circuit diagram in block form illustrating the electrical components that may be provided on the rear surface of the rearview element of the present invention.

Referring back to FIG. 2, electrically conductive tracings 150 are disposed on the rear surface 12b of the first substrate 12 to provide electrical interconnections within the circuitry 20 to the various electrical components 21–116 mounted on the rear surface 12b. As shown in FIGS. 2, 3A and 4, one such electrical component may be an EC mirror/compass system 21, which includes a drive circuit 24 for the electrochromic reflective element 10a. The drive circuit 24 includes a digital-to-analog converter and various analog components (not shown), which are operated under control of a microprocessor 22 that is responsive to outputs from a glare sensor 26 and an ambient light sensor 28. The drive circuit 24 may be implemented in whole or in part in an application specific integrated circuit (ASIC). An example of such a drive circuit ASIC is disclosed in U.S. Patent Application Publication No. 2003/0234752 A1, the entire disclosure of which is incorporated herein by reference. The conductive tracings 150 may thus include tracings 150a and 150b that interconnect the electrodes (the reflective coating 15 and the transparent conductive layer 17) of the electrochromic reflective element 10a with the drive circuit 24. More specifically, the conductive tracing 150a may be electrically coupled to the reflective coating 15 and the conductive tracing 150b may be electrically coupled to the transparent conductive layer 17. A more detailed description of the manner by which such electrical couplings are formed is provided further below.

There are numerous derivative advantages to mounting the electronics directly upon the rear surface 12b of the first substrate 12. The resulting fully functional assembly can be fully tested prior to assembly into the housing. Ultimately, the advantages are primarily in reducing the cost of the product, styling freedoms, tooling cost/complexity reduction for new appearance versions, and ability to add large displays in a cost and implementation effective manner. The cost of the electronic portion of the product is reduced via elimination of the printed circuit board, lower installation labor, fewer interconnection parts like wires and connectors, and inherently better RF properties saving components and other aspects needed to quell RF/EMI problems.

Cost of the housing is reduced due to it no longer having to provide the bulk of the strength or costly details to retain the printed circuit board. The very compact and inherently strong assembly also supports a smaller housing. Instead of a two-part case with complex interlocking details, a one-piece housing can be used. The housing is deflected to receive the rearview element, with the housing being molded to the final desired shape including an internal nest for the rearview element. Then, secondary heat is used to allow the rearview element to enter the housing.

An alternative is to resize the housing using heat and pressure to a size large enough to accept the rearview element, and then heat is applied to allow the plastic housing to return to its molded size, capturing the rearview element. This is the same action as is done in "heat shrink tubing."

Figure 5:
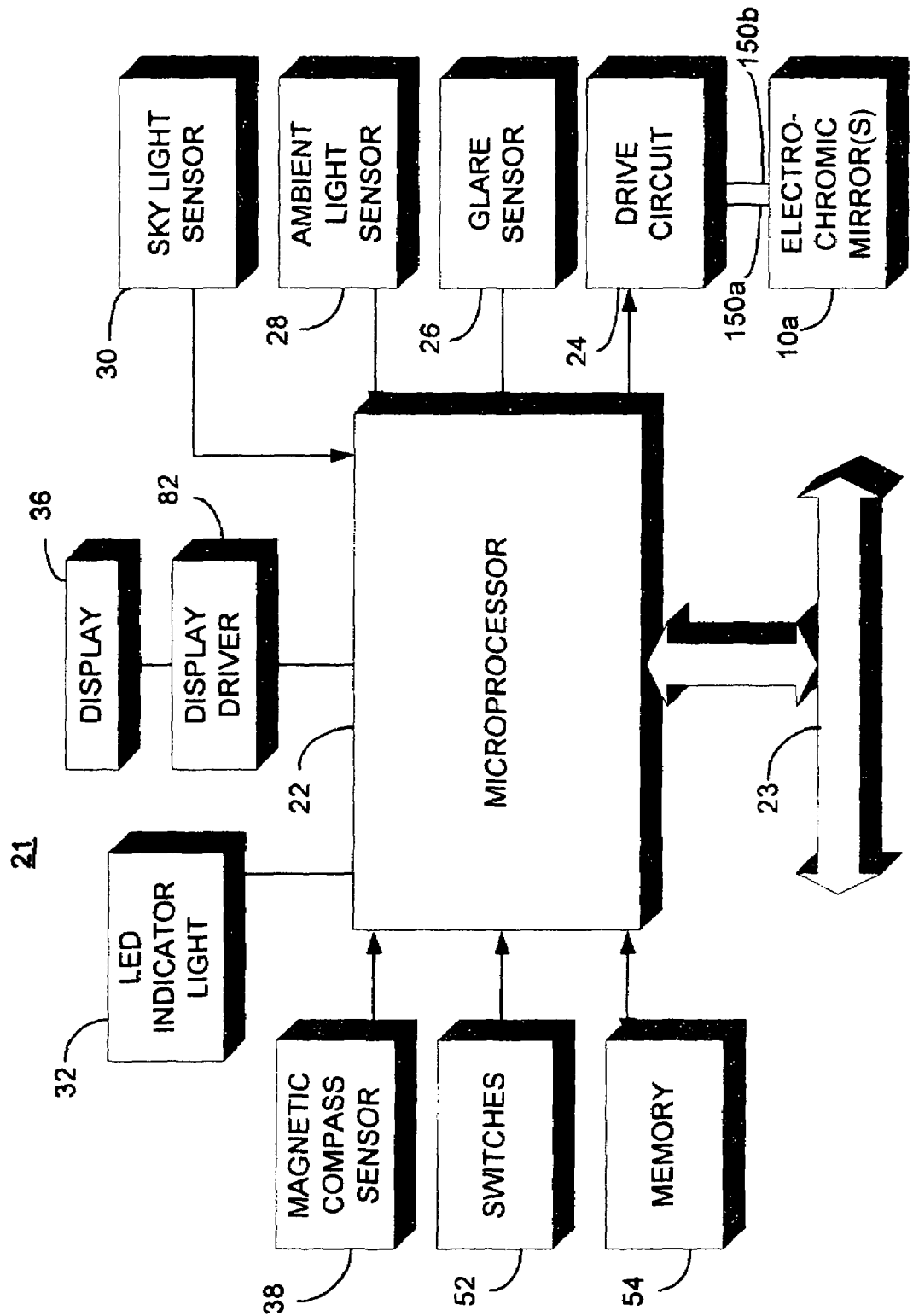
FIG. 5 is an electrical circuit diagram in block form showing the electrical components of an electrochromic mirror/compass system, which may be provided on the rear surface of the rearview element constructed in accordance with the present invention.

As shown in FIGS. 2, 4 and 5, the electronic components mounted to the rear surface 12b of the first substrate 12 may include any one or more of the following: the drive circuit 24; one or more light sources (such as an LED indicator light 32 or map lamps 34); one or more light sensors (such as a sky light sensor 30, an ambient sensor 28, or a glare sensor 26); a microprocessor 22; one or more display devices 36; a compass sensor circuit 38; a microphone transducer(s) 40a and 40b; a microphone processor or a digital signal processor (DSP) circuit 42; a voice recognition circuit 44; an audio amplifier 46; one or more speakers 48; a speech synthesizer 50; user actuated switches 52; memory circuits 54; a radio frequency (RF) transmitter, receiver, or transceiver (such as a BLUETOOTH™ transceiver 56, a cellular telephone transceiver 58, or a trainable garage door opener transmitter/remote keyless entry (RKE) receiver/tire pressure sensor receiver/electronic toll collection (ETC) transceiver 60); an RF antenna 62, 64, 66; an infrared (IR) transmitter, receiver or transceiver 68; a microwave receiver 70 (such as a global positioning system (GPS) receiver or a satellite radio receiver); a microwave antenna 72; an imaging sensor 74; a moisture sensor 76; a vehicle bus interface 78 coupled to a vehicle bus 80; a display driver circuit 82; a BLUETOOTH™ controller 84; a power supply 86 with an optional back-up battery; and a battery heater 88. The electronic components may also include any one or more of the following: security lights; a GPS receiver; a GPS antenna; an RF antenna; an RF transmitter, receiver, or transceiver; and one or more diodes, which may be connected to one of the first and second electrically conductive layers of an electrochromic reflective element 10a for protection from reverse polarity connection to a power supply. Details of some of these electrical components are described further below. The electrical components are shown as being connected to the vehicle bus 80.

In the illustrated embodiment, the first substrate 12 may be opaque, but is preferably transparent or transflective if a display or light sources are positioned to project light through the electrochromic reflective element 10a, or if light sensors are positioned to sense light passing through the electrochromic reflective element 10a. Preferably, the first substrate 12 is made of glass. Providing electronics on glass is prevalent in the field of liquid crystal displays where on-glass electronics avoid the massive numbers of connections required for each pixel. Schott Glass of Mainz, Germany is among those companies selling glass for on-glass electronics. Such glass includes layers of very thin glass from stacks, which yields very high densities. This type of glass is preferable because of its high relative heat transfer, dielectric properties, and its transparency.

The illustrated first and second substrates 12 and 14 may be any material which is transparent and has sufficient strength to be able to operate in the environmental conditions to which the device will be exposed, e.g., varying temperatures and pressures commonly found in the automotive environment. The substrates 12 and 14 may comprise any type of borosilicate glass, soda lime glass, float glass, or any other material, such as, for example, MYLAR®; polyvinylidene chloride; polyvinylidene halides, such as polyvinylidene fluoride; cyclic olefin copolymers like Topas® available from Ticona, LLC of Summit, N.J., that is transparent in the visible region of the electromagnetic spectrum; and other polymers. The second substrate 14 is preferably a sheet of glass. The first substrate 12 should meet the operational conditions outlined above, except that it does not need to be transparent in all applications, and therefore may comprise polymers, metals, glass, ceramics, and preferably is a sheet of glass.

Furthermore, the illustrated substrates 12 and 14 may be treated or coated as is described in U.S. Pat. No. 6,239,898 entitled "ELECTROCHROMIC STRUCTURES," U.S. Pat. No. 6,193,378 entitled "AN ELECTROCHROMIC DEVICE HAVING A SELF-CLEANING HYDROPHILIC COATING," and U.S. Pat. No. 6,816,297 entitled "AN ELECTRO-OPTIC DEVICE HAVING A SELF-CLEANING HYDROPHILIC COATING," filed on Jun. 23, 2000, the entire disclosures of which are incorporated herein by reference. Other treatments, such as anti-reflectance coatings, hydrophilic coatings, low-E coatings, and UV-blocking layers, are also envisioned. Such coatings may also be applied to the substrates 12 and 14 in this and other embodiments.

In the illustrated example, the transparent conductive layer 17 may be any material which bonds well to the second substrate 14, is resistant to corrosion to any materials within the electrochromic rearview element 10a, resistant to corrosion by the atmosphere, has minimal diffuse or specular reflectance, high light transmission, near neutral coloration, and good electrical conductance. The transparent conductive layer 17 may be fluorine-doped tin oxide, doped zinc oxide, zinc-doped indium oxide, indium tin oxide (ITO), ITO/metal/ITO (IMI) as disclosed in "Transparent Conductive Multilayer-Systems for FPD Applications," by J. Stollenwerk, B. Ocker, K. H. Kretschmer of LEYBOLD AG, Alzenau, Germany; the materials described in above-referenced U.S. Pat. No. 5,202,787, such as TEC 20 or TEC 15, available from Libbey-Owens-Ford Co. of Toledo, Ohio; or other transparent conductors. Generally, the conductance of the transparent conductive layer 17 will depend on its thickness and composition. IMI generally has superior conductivity compared to the other materials. IMI is, however, known to undergo more rapid environmental degradation and suffer from interlayer delamination. The thickness of the various layers in the IMI structure may vary, but generally the thickness of the first ITO layer ranges from about 10 Å to about 200 Å, the metal ranges from about 10 Å to about 200 Å, and the second layer of ITO ranges from about 10 Å to about 200 Å. If desired, an optional layer or layers of a color suppression material may be deposited between the transparent conductive layer 17 and the rear surface 14b to suppress the reflection of any unwanted portions of the electromagnetic spectrum.

In accordance with the present invention, the reflector (electrode) 15 is disposed on the front surface 12a of the first substrate 12. The reflector (electrode) 15 comprises at least one layer of a reflective material which serves as a mirror reflectance layer and also forms an integral electrode in contact with and in a chemically and electrochemically stable relationship with any constituents in the electrochromic medium 18. Accordingly, the first substrate 12 is different from conventional electrochromic devices, which incorporated a transparent conductive material on the front surface 12a as an electrode and placed a reflector on the rear surface 12b.

The illustrated reflector (electrode) 15 may be entirely reflective or may be partially reflective and partially transmissive (i.e., transflective). If the reflector (electrode) 15 is entirely reflective, a window 170 may need to be formed in front of any displays, LEDs, or sensors as shown in FIGS. 6, 8, 12 and 13. The window 170 may be formed only in some or all of the reflective layer(s) of the reflector (electrode) 15 such that a continuous layer of a transparent conductive material may overlie the display. Alternatively, a window may be formed while retaining a number of strips or other patterns of the reflective layer in front of the display or sensor as disclosed in U.S. Pat. No. 6,111,683, the entire disclosure of which is incorporated herein by reference. The reflector (electrode) 15 may alternatively be transflective, at least in the region in front of the display, LED or sensor or may be transflective across the entire mirror surface. Examples of suitable transflective and reflective coatings are disclosed in U.S. Pat. Nos. 6,356,376 and 6,700,692, the entire disclosures of which are incorporated herein by reference. The reflector (electrode) 15 may be tied to an AC or DC ground to provide a ground plane for the circuitry attached to the glass. This ground plane can reduce RF emissions and RF susceptibility from the circuitry mounted on the rearview element.

Referring to FIG. 3A, the two substrates 12, 14 of the electrochromic reflective element 10a are joined by the seal 16. The seal 16 serves to provide a chamber between substrates 12 and 14 in which the electrochromic medium 18 is contained in contact with both electrodes (the reflective coating 15 and the transparent conductive layer 17). The seal 16 may be any material that is capable of adhesively bonding to the coatings on the inner surfaces of the substrates 12 and 14 to seal the perimeter, such that electrochromic material 18 does not leak from the chamber defined between the substrates 12 and 14. The seal 16 preferably has good adhesion to glass, metals, and metal oxides; preferably has low permeabilities for oxygen, moisture vapor, and other detrimental vapors and gasses; and must not interact with or poison the electrochromic material 18 it is meant to contain and protect. Examples of suitable seal materials are disclosed in U.S. Pat. Nos. 5,790,298; 6,157,480; and 6,195,193, the entire disclosures of which are incorporated herein by reference.

The electrochromic medium 18 includes electrochromic anodic and cathodic materials that can be grouped into the following categories:

Single layer—the electrochromic medium is a single layer of material which may include small inhomogeneous regions and includes solution-phase devices where a material is contained in solution in the ionically conducting electrolyte and remains in solution in the electrolyte when electrochemically oxidized or reduced. U.S. Pat. No. 6,193,912 entitled "NEAR INFRARED-ABSORBING ELECTROCHROMIC COMPOUNDS AND DEVICES COMPRISING SAME"; U.S. Pat. No. 6,188,505 entitled "COLOR STABILIZED ELECTROCHROMIC DEVICES"; U.S. Pat. No. 6,262,832 entitled "ANODIC ELECTROCHROMIC MATERIAL HAVING A SOLUBLIZING MOIETY"; U.S. Pat. No. 6,137,620 entitled "ELECTROCHROMIC MEDIA WITH CONCENTRATION ENHANCED STABILITY PROCESS FOR PREPARATION THEREOF AND USE IN ELECTROCHROMIC DEVICE"; U.S. Pat. No. 6,195,192 entitled "ELECTROCHROMIC MATERIALS WITH ENHANCED ULTRAVIOLET STABILITY"; U.S. Pat. No. 6,392,783, entitled "SUBSTITUTED METALLOCENES FOR USE AS AN ANODIC ELECTROCHROMIC MATERIAL AND ELECTROCHROMIC MEDIA AND DEVICES COMPRISING SAME"; and U.S. Pat. No. 6,249,369 entitled "COUPLED ELECTROCHROMIC COMPOUNDS WITH PHOTOSTABLE DICATION OXIDATION STATES" disclose anodic and cathodic materials that may be used in a single layer electrochromic medium, the entire disclosures of which are incorporated herein by reference. Solution-phase electroactive materials may be contained in the continuous solution phase of a cross-linked polymer matrix in accordance with the teachings of U.S. Pat. No. 5,928,572, entitled "IMPROVED ELECTROCHROMIC LAYER AND DEVICES COMPRISING SAME" or International Patent Application No. PCT/US98/05570 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," the entire disclosures of which are incorporated herein by reference.

At least three electroactive materials, at least two of which are electrochromic, can be combined to give a pre-selected color as described in U.S. Pat. No. 6,020,987 entitled "ELECTROCHROMIC MEDIUM CAPABLE OF PRODUCING A PRE-SELECTED COLOR," the entire disclosure of which is incorporated herein by reference. This ability to select the color of the electrochromic medium is particularly advantageous when designing architectural windows.

The anodic and cathodic materials can be combined or linked by a bridging unit as described in International Application No. PCT/WO97/EP498 entitled "ELECTROCHROMIC SYSTEM," the entire disclosure of which is incorporated herein by reference. It is also possible to link anodic materials or cathodic materials by similar methods. The concepts described in these applications can further be combined to yield a variety of electrochromic materials that are linked.

Additionally, a single layer medium includes the medium where the anodic and cathodic materials can be incorporated into the polymer matrix as described in International Application No. PCT/WO98/EP3862 entitled "ELECTROCHROMIC POLYMER SYSTEM," U.S. Pat. No. 6,002,511, or International Patent Application No. PCT/US98/05570 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," the entire disclosures of which are incorporated herein by reference.

Also included is a medium where one or more materials in the medium undergoes a change in phase during the operation of the device, for example, a deposition system where a material contained in solution in the ionically conducting electrolyte which forms a layer or partial layer on the electronically conducting electrode when electrochemically oxidized or reduced.

Multilayer—the medium is made up in layers and includes at least one material attached directly to an electronically conducting electrode or confined in close proximity thereto which remains attached or confined when electrochemically oxidized or reduced. Examples of this type of electrochromic medium are the metal oxide films, such as tungsten oxide, iridium oxide, nickel oxide, and vanadium oxide. A medium, which contains one or more organic electrochromic layers, such as polythiophene, polyaniline, or polypyrrole attached to the electrode, would also be considered a multilayer medium.

In addition, the electrochromic medium may also contain other materials, such as light absorbers, light stabilizers, thermal stabilizers, antioxidants, thickeners, or viscosity modifiers.

It may be desirable to incorporate a gel into the electrochromic device as disclosed in commonly assigned U.S. Pat. No. 5,940,201 entitled "AN ELECTROCHROMIC MIRROR WITH TWO THIN GLASS ELEMENTS AND A GELLED ELECTROCHROMIC MEDIUM," filed on Apr. 2, 1997. The entire disclosure of this U.S. patent is incorporated herein by reference.

As illustrated in FIG. 3A, the electrochromic reflective element 10a further includes a pair of electrical bus clips 19a and 19b that are respectively clipped about the perimeter of first and second substrates 12 and 14 in such a manner as to physically and electrically contact the electrodes (the reflective coating 15 and the transparent conductive layer 17). In this embodiment, the first and second substrates 12 and 14 are offset so as to accommodate the bus clips 19a and 19b. In this embodiment, the seal 16 is made of a nonconductive epoxy. On the rear surface 12b, the conductive tracing 150a extends under the bus clip 19a that is coupled to the reflective coating 15 (electrode)-such that the clip 19a electrically couples the tracing 150a and the reflective coating 15 (electrode). The tracing 150a is coupled to a terminal of the drive circuit 24, which is mounted to the rear surface 12b. The conductive tracing 150b extends from a second terminal of the drive circuit 24 and is electrically coupled to the second clip 19b via a wire 13. The second clip 19b and the wire 13 thus couple the tracing 150b to the transparent conductive layer 17 (electrode). The bus clips 19a and 19b thus enable electrical current to flow between the drive circuit 24 through first and second electrodes (the reflective coating 15 and the transparent conductive layer 17) and the electrochromic medium 18 contained in the chamber therebetween. In this manner, the light transmittance of the electrochromic reflective element 10a may be varied in response to electrical control of the drive circuit 24. The bus clips 19a and 19b may be made of any known construction and known materials. One possible construction for the bus clips 19a and 19b is disclosed in U.S. Pat. No. 6,064,509 entitled "CLIP FOR USE WITH TRANSPARENT CONDUCTIVE ELECTRODES IN ELECTROCHROMIC DEVICES" filed on Aug. 22, 1997, by Tonar et al., the disclosure of which is incorporated herein by reference.

As described above, the bus clips 19a and 19b are used as a means of uniformly transferring electricity from lead wires or tracings to the conductive coatings that have been previously deposited on the substrates 12 and 14. This can also be accomplished by the use of a metal-doped paint or coating (such as silver, copper, etc.), epoxy, resin, or by the use of conductive adhesive tapes, such as those available from the 3M Corporation. Examples of these tapes are 3M's Electrically Conductive Adhesive Transfer Tape #9703 and #9713. Additionally, metal foil or exposed wire may be used. Yet another alternative is the approach shown in FIG. 3C and described below.

The electrically conductive tracings 150 may be applied to rear surface 12b using a number of different techniques. According to one embodiment, a mask is applied to rear surface 12b and then the masked substrate is coated using a sputtering process. The first substrate 12 can be masked by various means, including contact printing prior to sputtering a conductive material onto the rear surface 12b to form the conductive tracings 150. By using "tube coaters," masking may be far more practical than in conventional coaters. The circuit should be carefully designed to fit the limitations of masking. The mask blocks areas on the rear surface 12b from receiving metal so the circuit layout and tracings should be designed to avoid islands of uncoated areas as such islands cannot be readily supported in a single mask. The degree of detail in the circuit tracings should also be coarse enough to allow use of a mask. The exact level of possible detail is determined by the thickness of the mask, the flatness of the mask against the glass, and the means used to clean the mask of deposited metal.

Another possible method of applying a sputtering-based metal circuit is to apply metal to the entire rear glass surface and then remove excess metal by laser or chemical etching to form the isolated circuit tracings. Preferably, the applied metal has three layers. A first layer is made of chromium to obtain good bonding to the rear surface of the first substrate 12. A top layer is made of a material exhibiting good electrical conductive properties like copper, silver, or gold. The center layer preferably provides a good bond to both chromium and the top conductive layer. In this three-layer construction, layers of chromium, nickel, and copper are the most preferred combination of materials. Thus, the method could include the steps of depositing a layer of chromium (or layers of chromium and the next material layer), then etching the layer(s) to define the tracings, and last, electroless plating of the etched structure with copper or the like.

It is desirable for the metal coating to be thin enough to limit conduction and to introduce some resistance. The resulting impedance tends to decouple the larger conductive regions thereby reducing the emission of EMI. Relatively few circuits in an electrochromic rearview assembly carry significant currents so there is no functional penalty for introducing such resistance and the discrete resistors normally needed to decouple can be reduced or eliminated.

In addition to forming the circuit traces via laser, chemical etching in combination with photo resist techniques can be used as is done in the current printed circuit board industry.

Every means currently employed in printed circuit board manufacture can be applied to glass with glass replacing the board.

The trace pattern can also be created by electroless plating, replacing or augmenting the above-described sputtered coating. Using electroless plating techniques, silver, copper or other conductive metals may be deposited onto the first substrate 12. In this method, an electroless metal solution is applied directly to the rear surface 12b by inkjet printing or by other means to form a conductive trace. The process involves the reduction of a complexed metal using a reducing agent such as aldehyde and hypophosphite to form a conductive metal trace. Copper can be electroless plated onto the first substrate 12 by first adding a catalytic seed layer, like palladium, which is deposited on the surface in extremely small amounts by inkjet printing or other methods. This seed layer is then exposed to a complexed metal salt material and a reducing agent. The metallic material is only deposited in regions where there is a seed layer.

Yet another way to create a circuit trace pattern is to apply a conductive adhesive directly to the glass. This can be done by screen printing, micro volume dispensing or regular needle dispensing. When this approach is used to form the traces, the same adhesive application can be used to attach the components.

Another technique is to inkjet print a conductive material like copper, nickel, cobalt, silver, gold, platinum, and other metals onto the first substrate 12. A preferred inkjet printing technique is the technique (also called Conductive Inkjet Technology) developed by a joint venture between Xennia Technology Limited, Lumen House, Lumen Road, Royston, Hertfordshire SG8 7AG, United Kingdom and Carclo plc, Ploughland House, P.O. Box 14, 62 George Street, Wakefield, WF1 1ZF United Kingdom. This joint venture is known as Conductive InkJet Technology Limited, Ploughland House, P.O. Box 14, 62 George Street, Wakefield, West Yorkshire, WF1 1ZF, United Kingdom.

Another method that can be used is to make traces of copper, nickel, or other conductive material(s) as described in a paper by Y. Tu, G. H. Chapman, and M. V. Sarunic "Bimetallic Thermal Activated films for Microfabrication, Photomasks and Data Storage," Proceedings SPIE Photonics West, Laser Applications in Microelectronics and Optoelectronics Applications, Vol. 4637, pages 330–340. In this work, a bimetallic thermal resist of Bi/In was coated on a substrate like glass, and then the thermal resist was directly written on with a laser. Where exposed, an alloyed resist is formed. The resist is developed, leaving only the Bi/In alloy at the surface of the substrate where it was exposed by the laser. Since this alloy is conductive, other conductive metals can be directly electroplated onto this metallic alloy to form metal traces.

Another technique to apply the tracing 150 is to use inkjet printing of nanoparticles as described in the Materials Research Society Symposium Proceedings Vol. 769H8.3.1.

Another technique is to use MOCVD (metallo-organic chemical vapor deposition) processes or inkjet printing to apply a liquid precursor, such as hexafluoroacetylacetonate Cu(I) trimethylvinyl silane (or triethoxyvinylsilane), which upon heating or other treatment decomposes yielding metal traces, as described in *Applied Physics Letters* 68(7) 1996; NREL conference paper NREL/CP-520-31020.

Another technique for applying the tracings 150 is the use of a solid-phase silver precursor, Silver(I) hexafluoroacetonylacetonate complexed to an alkene (such as cyclooctadiene (COD) or trimethyl vinyl silane (tmvs)). The precursor is dissolved in a solvent (e.g., terpineol) and patterned by inkjet printing or by other means. Thermal decomposition of the deposited precursor yields metallic silver and a volatile by-product. This technique is described in Organometallics 1985, 4,830–835; NREL conference paper NREL/CP-520-31020.

The illustrated tracings 150 may also be applied by deposition of a mixture of a liquid MOCVD precursor containing metal nanoparticles. The metal nanoparticles are "glued" together by the metal derived from the decomposition of the MOCVD precursor to form conductive traces. An example of this technique is described in NREL conference paper NREL/CP-520-31020.

Yet another method for forming the tracings 150 is by laser direct-write (LDW). In general, LDW is a process of creating a pattern of selective conductive materials on a substrate by the transfer of the conductive material with a steady pulsed laser beam from a UV-transparent ribbon support to a receiving substrate.

Still another method for forming the tracings 150 is by photoreduction of a metal salt. In this method, a metal salt solution is applied to the rear surface 12b of the first substrate 12, and then is developed by an illuminating light that photoreduces the metal salt to a conductive material. A pattern of the conductive material could be formed by either selectively patterning the conductive material with a laser or by first masking the surface followed by the photoreduction. Also, a metal salt solution could be directly patterned on the surface of a substrate by inkjet printing or by other means followed by the photo illumination.

Another method for forming the tracings 150 is to use Laser Chemical Vapor Deposition (LCVD). An example of this method is described in Y. Morishige and S. Kishida "Thick Gold-Film Deposition by High-Repetition Visible Pulsed-Laser Chemical Vapor Deposition," Applied Physics A, 59; 395–399, 1994.

As shown in FIGS. 2 and 7, when the tracings 150 may have to cross paths, it may be appropriate to use a jumper wire 180, which is secured to opposite ends of an interrupted tracing that allows the perpendicular tracing to pass while retaining its electrical isolation from the interrupted tracing 150.

After the trace pattern has been formed on the rear surface 12b, the electrical components are then attached. Component attachment can be via solder, essentially as is done in conventional printed circuit board assemblies. When the mirror element is a preassembled electrochromic element, there is an added concern that heating the electrochromic element to soldering temperatures may harm the electrochromic medium. This concern can be eliminated by attaching the components prior to filling the electrochromic element with the electrochromic medium. Elevating the temperature of the electrochromic element for the time needed to solder does not harm the seal 16 of epoxy and may beneficially reduce contamination by fully curing the seal of epoxy.

Because a number of glass reject causes are not directly detectable when the electrochromic rearview element has not yet been filled with an electrochromic medium, it may be desirable to carefully test the competed assembly in order to reduce glass scrap as a result of such defects. Using optical techniques like edge lighting, small imperfections can be easily seen without the aid of the darkened electrochromic medium serving as a background.

Conductive adhesives can be substituted for solder. Conductive adhesives have the advantage of potentially lower setting temperatures. If held below the softening temperature of the seal 16 of epoxy, about 125° C., the electronics can be safely applied to pre-filled electrochromic rearview elements without causing leaking of the electrochromic medium. This means the electrochromic rearview elements can be tested prior to electronics attachment, avoiding the glass scrap concern.

If thermosetting adhesives are used, rework may be impractical. This may not be a problem if yield is high enough. An alternative that would support rework is a conductive adhesive with a thermoplastic base. Being thermoplastic it can be re-melted just like solder but at a much lower temperature, thereby supporting reworking.

Conductive adhesives can be placed via screen printing, micro volume dispensing or conventional needle dispensing. As mentioned above, if the adhesive is used for the trace patterns, one application can serve both trace and attachment functions.

FIG. 6 shows a cross-sectional view of a portion of the electrochromic reflective element 10*a*, which includes a display device 36 mounted to the rear surface 12*b* of first substrate 12. In this particular embodiment, the tracings 150 are formed by conductive inkjet printing or by other means. Such tracings 150 may not have sufficient adhesive properties for bonding electrical components to the rear surface 12*b* of the first substrate 12. Accordingly, an electrically conductive epoxy or other adhesive 152 may be applied under each terminal leg 171 of the electronic components. Such an electrically conductive epoxy 152 would secure the electronic components to the rear surface 12*b* while also ensuring good electrical coupling between each lead and each of the tracings 150. In the particular example shown in FIG. 6, the display device 36 may further be secured to the rear surface 12*b* of substrate 12 using an optical adhesive 172. As further illustrated in FIG. 6, the display device 36 is mounted to a particular region on the rear surface 12*b* of the first substrate 12 where a window 170 has been formed in the reflector (electrode) 15 so as to allow light emitted from the display 36 to pass through the first substrate 12. As noted above, the window 170 may not be necessary in the event that the reflector/electrode is transflective.

Figure 11:
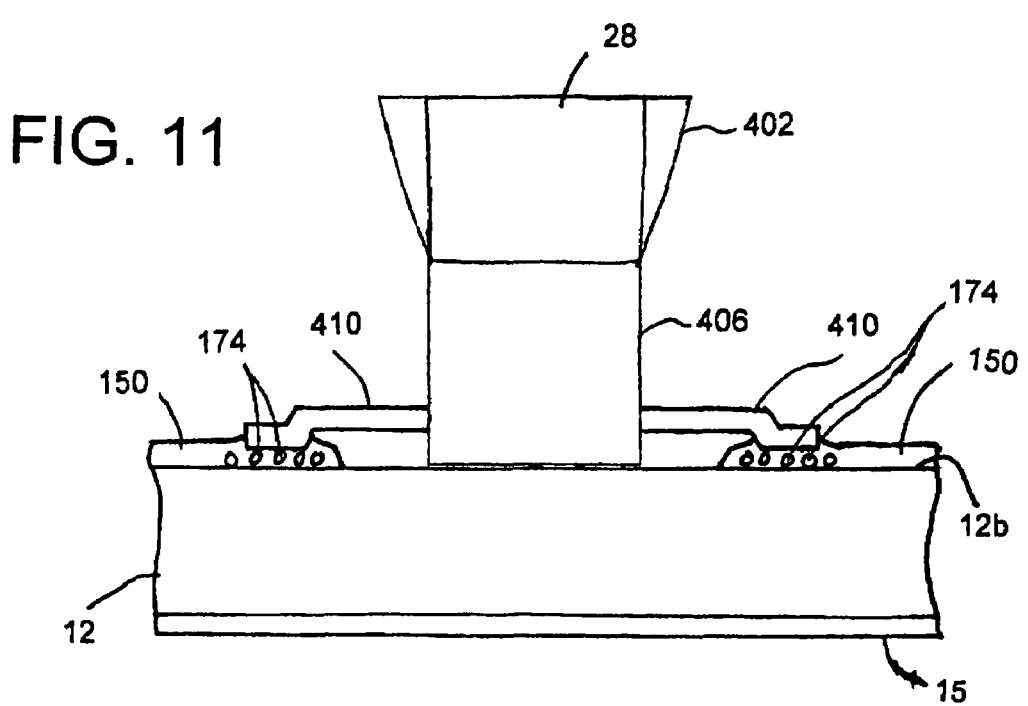
FIG. 11 is a partial cross-sectional view of a portion of the rearview element showing the ambient light sensor from the side.

FIG. 11 shows another technique whereby an electronic component may be mounted to the rear surface 12*b* of the first substrate 12. In this example, a glare sensor 26 is mounted to the rear surface 12*b* in an area behind the window 170, which allows light to pass through the electrochromic rearview element 10*a* to the sensor 26. Also in this example, the tracings 150 are made of a conductive epoxy, which itself will secure the leads 410 of electronic components such as the sensor 26 to the rear surface 12*b* of first substrate 12. One potential problem associated with using such a conductive epoxy, however, is that the epoxy may tend to "squish out" when the leads of the electronic component are pressed into the epoxy. As the conductive epoxy squishes outward, it may become possible that the epoxy under a closely spaced adjacent lead may also squish out and create a short between two leads of the electronic component. To prevent such shorting, spacer beads 174 may be disposed within the conductive epoxy. Such beads 174 may be made of electrically conductive material or non-conductive material and may be mixed uniformly throughout the tracings 150 applied to the rear surface 12*b* of glass first substrate 12. Alternatively, such beads 174 may be deposited only in those regions that are potentially squished out by leads of the electronic components. Another technique for preventing shorting is to provide non-conductive epoxy or other material between each of the conductive epoxy tracings in the vicinity of where a device is to be secured. Such non-conductive epoxy would serve as an electrically insulating barrier to prevent shorting when the electronic component is pressed into the conductive epoxy.

The sensor/electronic component may further be secured to the rear surface 12*b* of the first substrate 12 using an optical adhesive. For those components that are not optical or that do not require light to pass through the rearview element 10, any form of suitable epoxy may be used, if needed, to secure the bottom surface of the electrical component to the rear surface 12*b*.

Once the components are mounted on the glass first substrate 12, connection between the electronics and the conductive electrode layers on the inside of the electrochromic rearview element 10*a* may be made. The conventional means of using metal bus clips 19 and wires 13 (FIG. 3A) can be used, but avoiding wires, clips, and connectors is possible thereby simplifying assembly and reducing manufacturing and component cost. Conductive adhesive can be laid down in a bead (150*a*, 150*b*) making contact along a large length of an electrochromic rearview element to adequately couple to each electrode layer (the reflective coating 15 and the transparent conductive layer 17). A wire can be dispensed into this bead to help lateral conduction, reducing the need for expensive fillers to get the required conduction.

Figure 3B:
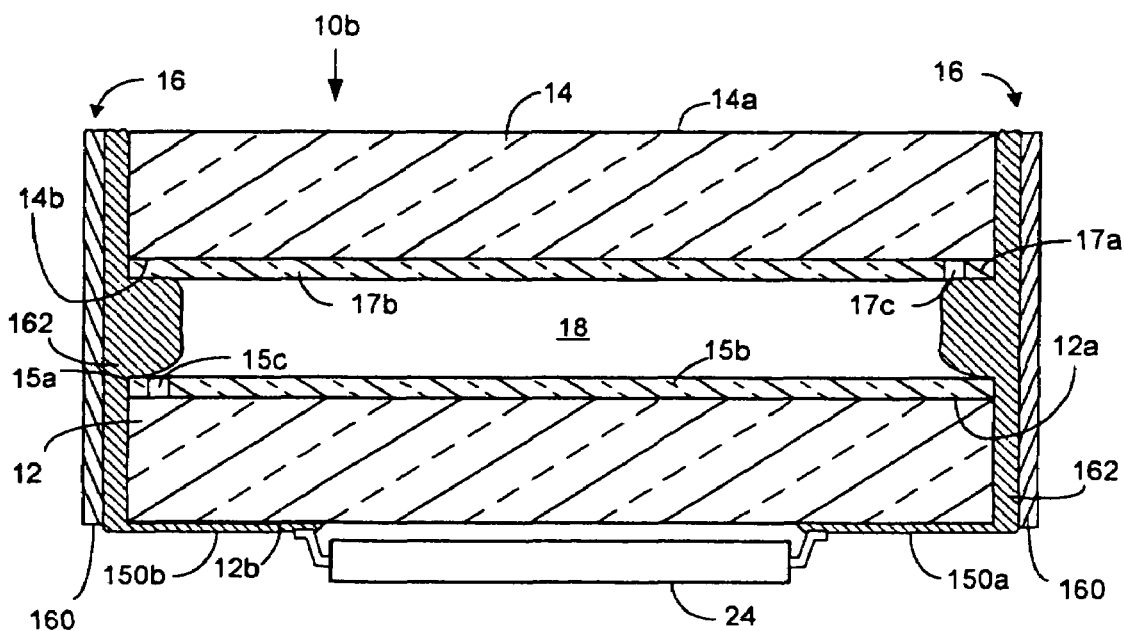
FIG. 3B is a cross-sectional view of a portion of the rearview element constructed in accordance with a second embodiment of the rearview element of the present invention.

FIG. 3B shows a second embodiment of the electrochromic rearview element 10*b*, which eliminates the bus clips 19*a* and 19*b* and the wire 13. Instead, the seal 16 is made of an electrically conductive seal material 162 and is provided along the edge of the electrochromic rearview element 10*b*. As shown, the electrically conductive seal material 162 is provided that not only seals the chamber between substrates 12 and 14, but also provides an electrical connection to the electrodes (the reflective coating 15 and the transparent conductive layer 17). The conductive seal material 162 may also be applied to the rear surface 12*b* of the substrate 12 to thereby provide the tracings 150*a* and 150*b*, which are coupled to terminals of the drive circuit 24 (which is mounted to the rear surface 12*b*). The portion of the conductive seal material 162 comprising the tracings 150*a* and 150*b* may serve to bond the drive circuit 24 to the rear surface 12*b*. Additional adhesive material may be used if needed. A metal foil 160 is provided around the perimeter edge of the electrochromic rearview element 10*b* to protect the conductive seal material 162 and provide additional conductivity. If the tracings 150*a* and 150*b* are made of a material different from seal material 162, such as a conductive ink, either the conductive seal material 162 or the foil 160 may be in contact with the tracings 150*a* and 150*b* to provide a conductive path. To prevent shorting between electrodes (the reflective coating 15 and the transparent conductive layer 17), portions 15*c* and 17*c* of the electrodes (the reflective coating 15 and the transparent conductive layer 17) may be etched to electrically isolate the operational portions 15*b* and 17*b* of the electrodes (the reflective coating 15 and the transparent conductive layer 17) from non-operational portions 15*a* and 17*a* that contact the portion of seal material 162 that also contacts the operational portion of the other electrode.

Also, in this embodiment, the substrates 12 and 14 are not offset from one another. Eliminating the offset of the substrates 12 and 14 is advantageous in that it minimizes the extent to which a bezel may need to be employed to cover the offset and any bus clips. The rearview element 10*b* shown in FIG. 3B as well as many other designs that may be used with the present invention are further described in U.S. Pat. No. 7,064,882, entitled "ELECTROCHROMIC DEVICES HAVING NO POSITIONAL OFFSET BETWEEN SUBSTRATES," filed on Sep. 30, 2002, the entire disclosure of which is incorporated herein by reference.

As yet another method of making electrical connection to the electrode (transparent conductive layer) 17, a notched area in rear glass substrate 12 can be provided in which an electrically conductive bead is dispensed that extends between the electrode (transparent conductive layer) 17 and the rear surface 12b where the electronics are located. The electrical conductivity of this bead can also be enhanced by a wire or the bead may be replaced by a wire.

Figure 3C:
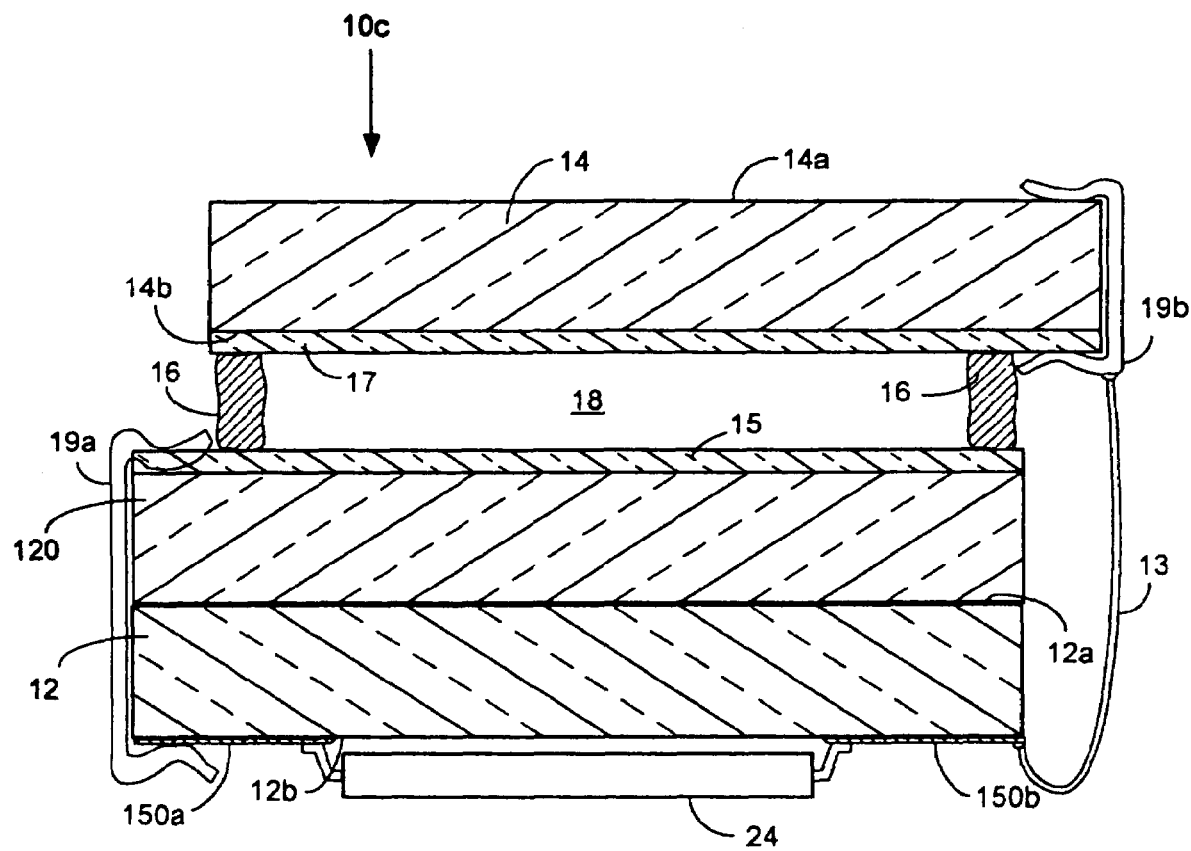
FIG. 3C is a cross-sectional view of a portion of a rearview element constructed in accordance with a third embodiment of the rearview element of the present invention.

FIG. 3C illustrates a third embodiment of the electrochromic rearview element 10c, wherein the first substrate 12 is a separate glass substrate from that used as the rear substrate of the rearview element 10a. In other words, with respect to an electrochromic rearview element, the second substrate 14 may be secured to a third substrate 120 (FIG. 3C) to form a sealed chamber therebetween for containing an electrochromic medium. In this embodiment, first substrate 12 may be separately formed with its associated electronic components and tracings provided on the rear surface 12b and subsequently bonded to the rear surface of the third substrate 120. This embodiment offers the advantages of providing a surface that is more likely to have a uniform flatness and thereby provide better uniformity of the traces. In addition, this embodiment may utilize a cheaper form of glass for either the first substrate 12 or the third substrate 120. Such a separate first substrate 12 would adhere well to the rear substrate of the reflective element since it would be possible to select an adhesive that bonds well to glass to bond both elements together. Further, such a construction would enhance the thermal conductivity of the electrochromic rearview element 10c as a whole by spreading the heat out without creating hot spots on the electrochromic rearview element 10c. In addition, low current components may be used.

Any of the first embodiment of the electrochromic rearview element 10a, the second embodiment of the electrochromic rearview element 10b and the third embodiment of the electrochromic rearview element 10c of the present invention can be used in the first embodiment of the rearview assembly 2 of the present invention.

As used herein, a "rearview assembly" 2 is a structure that provides an image of a scene to the rear of driver. As commonly implemented, such rearview assemblies 2 include a rearview element 10 such as a prismatic mirror or the electrochromic rearview element 10a described above. The rearview assembly 2 may additionally or alternatively include a rearview element 10 in the form of an electronic display that displays an image as sensed by a camera or other image sensor (see, for example, commonly assigned U.S. Pat. No. 6,550,949 entitled "SYSTEMS AND COMPONENTS FOR ENHANCING REAR VISION FROM A VEHICLE," filed on Sep. 15, 1998, by Frederick T. Bauer et al., the entire disclosure of which is incorporated herein by reference). Thus, a "rearview assembly" need not include a mirror element. In the embodiments described below, an electrochromic rearview mirror assembly is shown and described. It will be appreciated, however, that such embodiments could be modified to include a display and no mirror element.

Referring to FIGS. 1 and 8, rearview assemblies 2 embodying the present invention may include the bezel 212 which extends around the entire periphery of each individual rearview assembly. The bezel 212 conceals and protects the buss clips 19 of FIG. 3A, as well as the peripheral edge portions of the sealing member 16 and both the front and rear substrates (14 and 12, respectively). A wide variety of bezel designs are well known in the art, such as, for example, the bezel disclosed in U.S. Pat. No. 5,448,397. There are also a wide variety of housings well known in the art for attaching the rearview assembly to the inside front windshield of an automobile, or for attaching the rearview assemblies to the outside of an automobile.

As discussed above, rearview assemblies typically include various switches 52, which allow the user to select various functions performed by the electronics within the rearview assembly. Typically, electromechanical switches are provided on a portion of a printed circuit board that extends below the rearview element 10. Although such an arrangement may be used with certain features of the present invention, it may be possible to eliminate the need for a printed circuit board to support the switches. Specifically, the rearview element 10 may be made to extend slightly lower than a typical rearview element such that switches may be supported directly on the rearview element substrates. Thus, as shown in FIG. 8, the bezel 212 may be constructed to have a horizontal strip 210a that extends between the rearview element 10 viewing area and the portion of the rearview element to be used as a switch region.

Figure 9B:
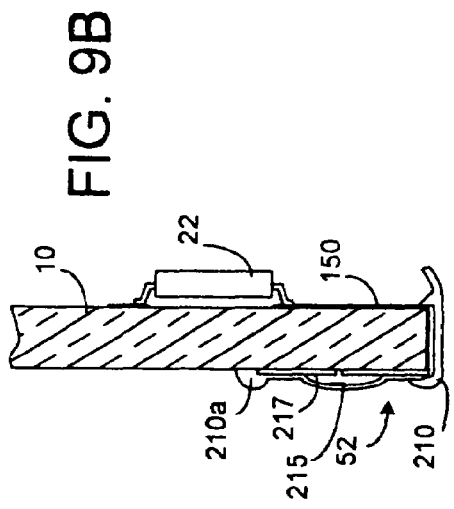
FIG. 9B is a cross-sectional view of a portion of the rearview assembly shown in FIG. 8 taken along lines IX—IX according to another embodiment of the present invention.
Figure 9A:
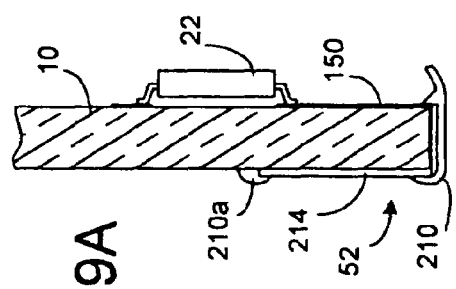
FIG. 9A is a cross-sectional view of a portion of the rearview assembly shown in FIG. 8 taken along lines IX—IX.

FIG. 9A is a cross-sectional view of a portion of the rearview assembly shown in FIG. 8. In the particular embodiment shown, a plurality of switches 52 is provided that includes a touch-sensitive display membrane switch member 214 that is electrically coupled to a tracing 150 that is disposed on the edge and the rear surface of the rearview element 10. The separate switches may be delineated by vertical lines printed on a surface of the rearview element in front of the reflective layer, or the reflective layer may be etched or removed entirely within the region behind the switch region. Alternatively, vertical portions of the bezel 212 may extend from the bottom-most portion of the bezel 212 upward to a horizontal strip 210a. Such a feature may be beneficial in that it would allow users to feel the demarcation between the various switches 52 provided on the rearview assembly. In addition, it may be possible to provide indicia indicating the function of the switch either on top of or behind the switch membrane 214 or on the rear surface of the rearview element 10. Such an indicia display could be constructed in the manner disclosed in U.S. Pat. No. 6,170,956, the entire disclosure of which is incorporated herein by reference. Further, the indicia displays may be illuminated using an LED mounted to the rear of rearview element 10 so as to project light through the rearview element and through the transparent areas of the indicia panel forming the indicia display. The LED may be a multi-chip LED, which is capable of changing color in response to a signal from the microprocessor 22 such that the color of the indicia display may change to indicate the status of the function associated with a particular switch.

FIG. 9B is a cross-sectional view of a portion of a different embodiment of the rearview assembly shown in FIG. 8. In the particular embodiment shown, a plurality of switches 52 is provided that include a membrane switch member 214 that, when depressed, selectively makes contact across two electrically isolated regions of a conductive layer 17 that are both electrically coupled to the tracings 150 on the edge and the rear surface of the rearview element 10. Suitable membrane switches are available from SSI Electronics of Belmont, Mich.

Although a particular switch structure is shown in FIGS. 8, 9A and 9B, it will be appreciated that the switches 52 may be formed using other types of switches. For example, a capacitive touch switch may be provided on the front surface of rearview element 10 that is also electrically coupled to circuitry on the rear of the rearview element. Further, another form of switch that may be employed is an optical proximity switch whereby an optical sensor and an LED that emits visible or infrared light may be positioned behind each switch region 52 such that when a user places his or her finger proximate the switch area 52, light that is emitted from the LED passes through the rearview element and is reflected from the user's finger back through the mirror and to the sensor. Suitable optical proximity switches are disclosed in U.S. Pat. No. 6,614,579, the entire disclosure of which is incorporated herein by reference.

Figure 10:
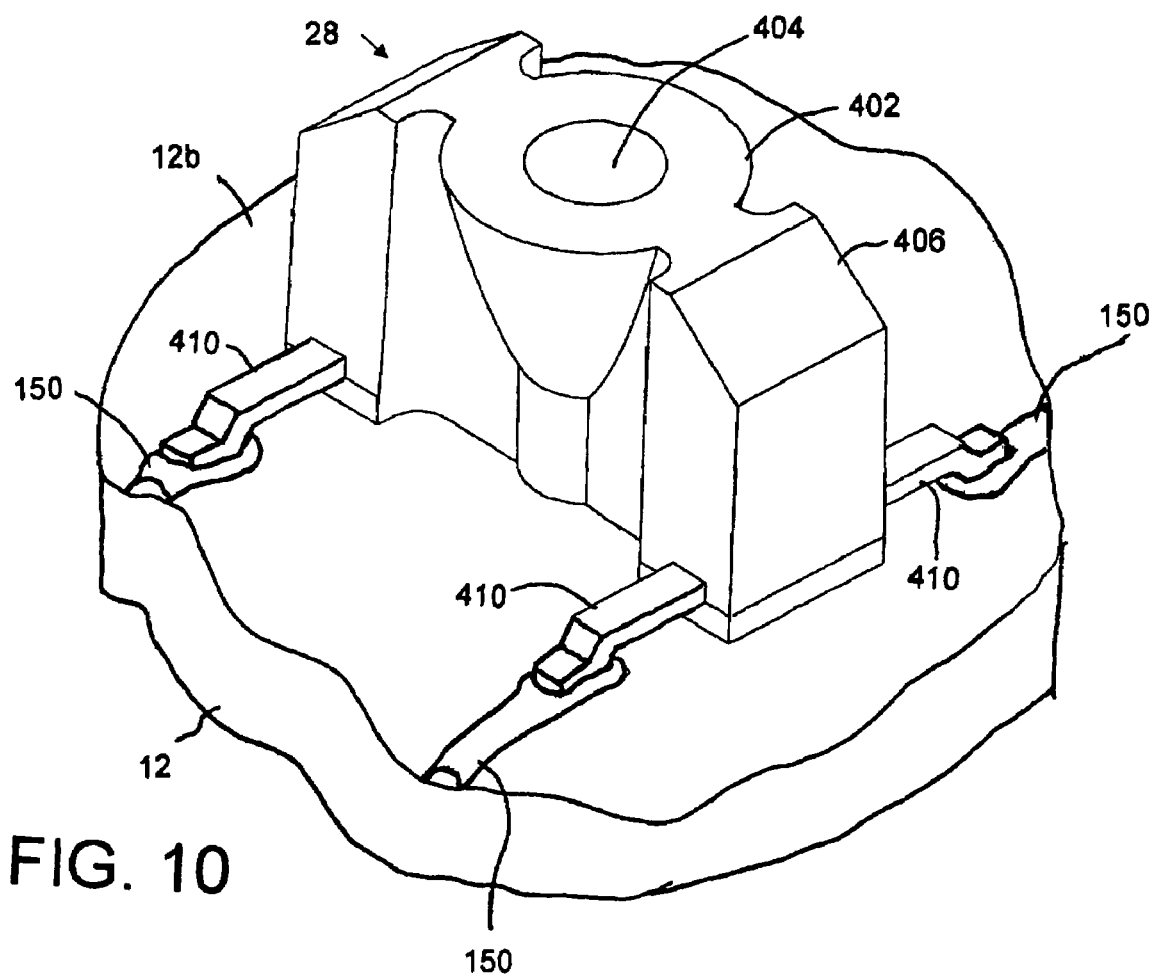
FIG. 10 is a cut-away perspective view showing a close-up of an ambient light sensor that may be used in the rearview element shown in FIG. 2.

FIGS. 10 and 11 show a suitable surface mount light sensor for use as the forward-looking ambient light sensor 28. This particular light sensor is disclosed in commonly assigned U.S. Pat. No. 6,805,474, the entire disclosure of which is incorporated herein by reference. This particular sensor is well suited for use in this particular application in that it is designed to be used as a surface mount device and can be mounted in spaced relation from any aperture formed within the rear housing member 208 of the housing. Preferably, a secondary optical element is disposed in such an aperture. Such a secondary optical element may be a diffuser and/or a lens designed to collect light from a particular field of view. The particular sensor shown in FIGS. 10 and 11 includes a collector portion 402 with an inner lens portion 404 so as to collect the maximum amount of light passing through an aperture within the housing and to focus the light onto the sensing element disposed within the encapsulant 406, which encapsulates the sensor on the lead frame 410 and is molded to function as the collector portion 402 and the lens portion 404. As shown in FIG. 11, the leads 410 of the sensor 28 may be bonded to the rear surface of the substrate 12 utilizing a suitable conductive epoxy as the tracings 150. If needed, spacers 174 may be disposed within the epoxy tracings to prevent squish out upon applying the sensor 28 to the substrate 12. Such squish out may not occur, however, if the bottoms of the leads 410 are slightly higher than the bottom surface of the sensor 28. It should also be noted that the bottom of the sensor 28 may be adhered to the rear surface 12b using any form of common adhesive. Further, the tracings 150 may take any of the forms described above.

Figure 12:
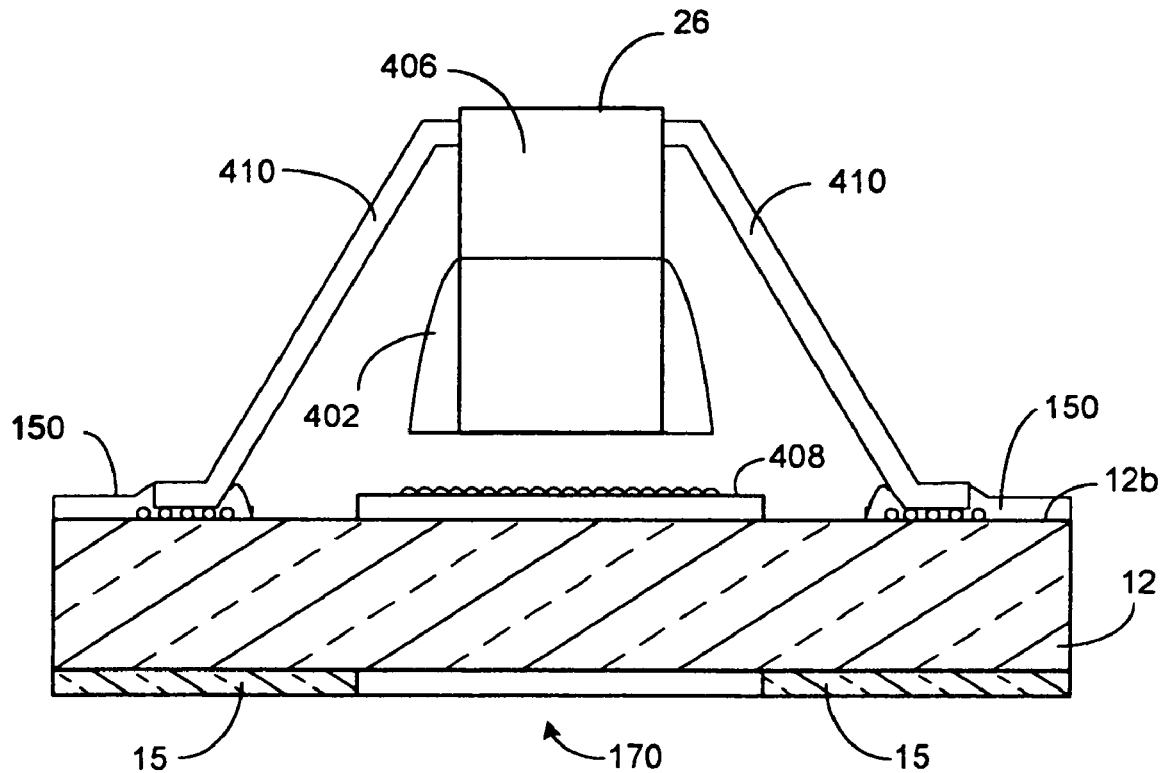
FIG. 12 is a partial cross section of the rearview element showing the side of a glare sensor that may be used in the rearview element shown in FIG. 2.

FIG. 12 discloses the same sensor but mounted upside down relative to the one shown in FIG. 10 such that the sensing element may serve as a glare sensor 26, which looks rearward through the glass substrate(s) of the rearview element. As shown in FIG. 12, a window 170 may be provided in the reflective electrode layer 15 to allow light to pass through to the sensor 26. In addition, a secondary optical element 408 is preferably provided to define the field of view and optionally to diffuse light received from within the field of view. Preferably, the secondary optical element 408 includes an anamorphic lens such as that disclosed in commonly assigned U.S. patent application Ser. No. 10/833,900, filed on Apr. 28, 2004, and entitled "DIMMABLE REARVIEW ASSEMBLY HAVING A GLARE SENSOR," the entire disclosure of which is incorporated herein by reference. An anamorphic lens permits the horizontal field of view to be different from the vertical field of view. The secondary optical element 408 may be attached directly to the rear surface 12b of the substrate 12 or may be spaced therefrom. Alternatively, the rear surface 12b may be etched to define a lens or diffuser in a region in front of the sensor 26.

Figure 13:
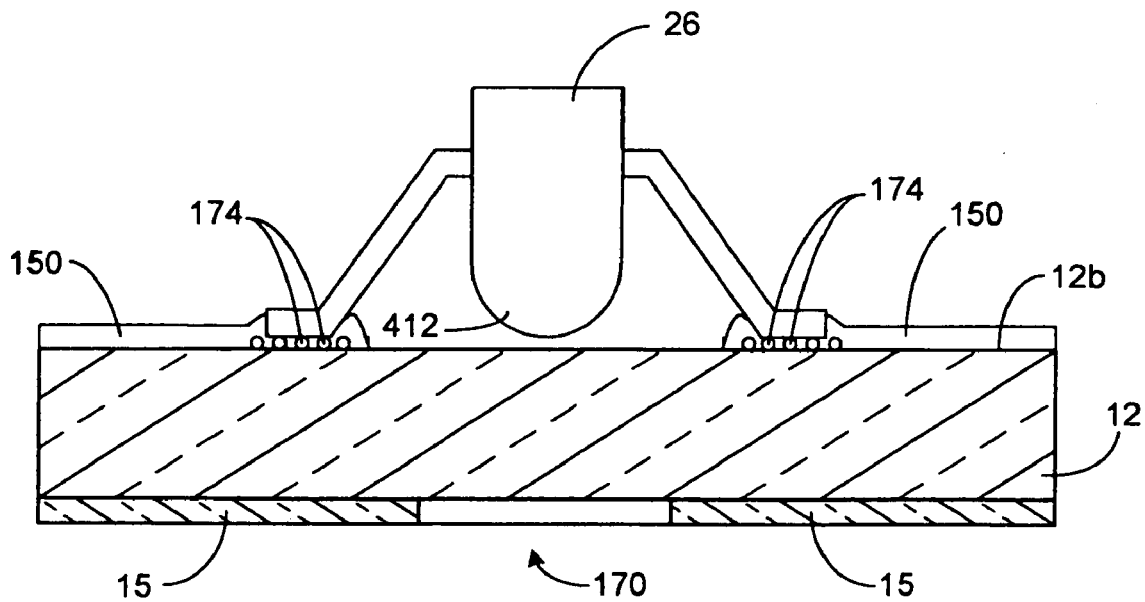
FIG. 13 is a partial cross section of the rearview element showing the side of a different glare sensor that may be used in the rearview element shown in FIG. 2.

FIG. 13 shows an alternative construction for the glare sensor 26. In this embodiment, the sensor 26 includes an integral anamorphic lens 412, such as that disclosed in U.S. Pat. No. 6,679,608 and in the above-referenced U.S. patent application Ser. No. 10/833,900, the entire disclosures of which are incorporated herein by reference. The anamorphic lens 412 may be cylindrical or bi-radial. By utilizing an integral anamorphic lens 412, a secondary optical element, such as element 408 in FIG. 12, may not be required to obtain a field of view having different dimensions horizontally and vertically. Although not shown in the drawings, it will be appreciated that the sensor shown in FIG. 13 is used as a glare sensor; the same sensor may be used as an ambient light sensor 28 by flipping the sensor over and bending the leads in the other direction.

The electrical output signal from either, or both, of the sensors 26 and 28 may be used as inputs to a controller (not shown) to control the reflectivity of the electrochromic rearview element 10a and/or the intensity of any one or all of the displays 36a and 36b. The details of various control circuits for use herewith are described in commonly assigned U.S. Pat. Nos. 5,883,605, 5,956,012, 6,084,700, 6,222,177, 6,224,716, 6,247,819, 6,249,369, 6,392,783 and 6,402,328, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

Rearview Element Support Assembly

Figure 14A:
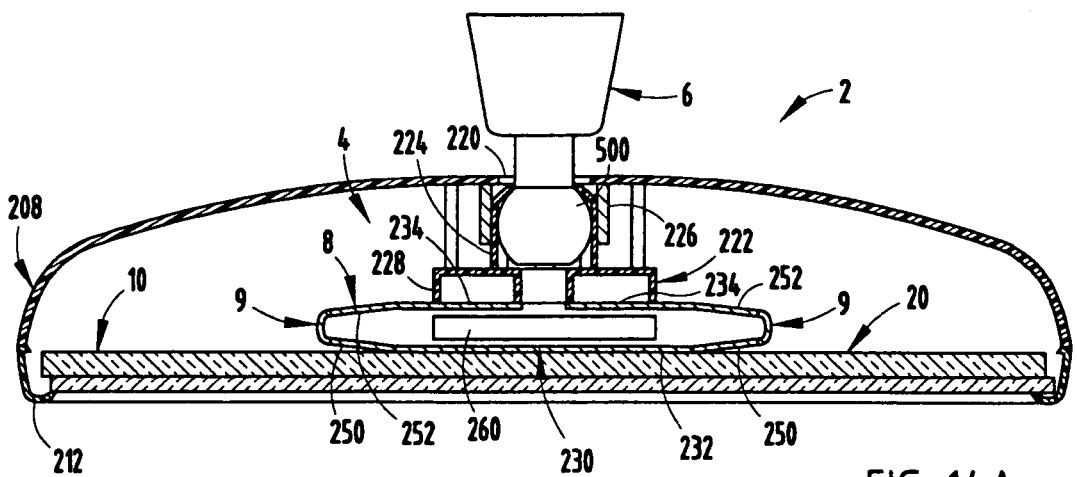
FIG. 14A is a top cross-sectional view of a first embodiment of the rearview assembly with a crush bracket in an uncompressed condition.

With reference to FIGS. 1, 2 and 14A, the illustrated rearview element 10 is supported by the rearview element support assembly 4 within the housing. The mount 6 is configured to connect the rearview assembly 2 to a windshield. At least one of the rearview element support assembly 4 and the mount 6 includes the crush bracket 8 having at least two legs 9 adapted to be compressed as a force strikes a front of the rearview element 10.

In the illustrated example, the mount 6 is adapted to be mounted inside the vehicle in a location proximate to or on a front windshield of the vehicle. The rearview assembly 2 can have a single ball mount system or a double ball mount system. An example of a rearview assembly including a mount having a single ball mounting system is illustrated in FIG. 1 and is disclosed in U.S. Pat. No. 6,467,919 entitled "MIRROR WITH SPLIT BALL MOUNT AND HOLD-OPEN DEVICE," the entire contents of which are hereby incorporated herein by reference. An example of a rearview assembly including a mount having a double ball mounting system is illustrated in FIG. 14E and is disclosed in U.S. Pat. No. 5,377,948 entitled "BREAKAWAY REARVIEW MIRROR MOUNTING BRACKET," the entire contents of which are hereby incorporated herein by reference. The mount 6 is connected to the windshield as discussed above and/or a headliner of the vehicle as is well known to those skilled in the art and as disclosed in U.S. Pat. Nos. 6,467,919 and 5,377,948, the entire contents of which are hereby incorporated herein by reference. Furthermore, in both the single ball and the double ball mounting system, the mount 6 includes a ball 500 extending therefrom configured to connect the rearview support assembly 4, the housing 5 and the rearview element 10 to the windshield and/or the headliner. A preferred mount is disclosed in U.S. Pat. No. 5,377,948.

The illustrated housing includes the bezel 212 and the rear housing member 208, with the rearview element 10 and the rearview element support assembly 4 being located within the housing. The bezel 212 is preferably snap fit to the rear housing member 208 and covers a perimeter of the rearview element 10 when the rearview element 10 is within the housing. However, the bezel 212 could be connected to the rear housing member 208 in any manner, including adhesives and mechanical connectors. The rear housing member 208 includes a rear opening 220 for accepting the ball 500 of the mount 6 therein for connection to the rearview element support assembly 4.

In the illustrated example, the rearview element support assembly 4 is connected to the ball 500 of the mount 6 and supports the rearview element 10 within the housing. The illustrated rearview support assembly 4 includes an adjustment socket 222 (see also FIG. 1) connected to the ball 500 of the mount 6 and the crush bracket 8. The adjustment socket 222 includes a connection panel 228 and a plurality of tabs 224 defining a spherical opening for accepting the ball 500 therein as is well known to those skilled in the art. After the ball 500 is inserted into the spherical opening, a spring member 226 is positioned about the tabs 224 to bias the tabs 224 about the ball 500 to thereby securely maintain the ball 500 within the adjustment socket 222. Alternatively, the spring member 226 can be installed before the ball 500 is inserted into the spherical opening. The adjustment socket 222 can be snap fit with, adhered to or mechanically connected to the rear housing member 208 as is well known to those skilled in the art.

The illustrated crush bracket 8 is adapted to be compressed as a force strikes a front of the rearview element 10. The crush bracket 8 comprises a support panel 230 and the at least two legs 9. The support panel 230 includes a substantially flat plate 232 connected to a rear face of the rearview element 10. In the illustrated example, two of legs 9 extend from opposite sides of the support panel 230. The legs 9 are U-shaped or bowed outwardly. The legs 9 each include a flange 234 on an end thereof opposite the support panel 230 configured to be connected to the connection panel 228 of the adjustment socket 222. Preferably, the support panel 230 is connected to a center portion of the rearview element 10 over the tracings 150 using double-sided adhesive tape. However, it is contemplated that the support panel 230 could be connected to the rearview element 10 in other manners. For example, if the rearview element 10 is a video screen, the support panel 230 could be mechanically connected to the rearview element 10. Furthermore, the legs 9 of the crush bracket 8 include a first leg portion 250 connected to the support panel 230 and a second leg portion 252 connected to the connection panel 228 of the adjustment socket 222. Preferably, fasteners extend through the flanges 234 of the second leg portion 252 and into the connection panel 228 to connect the crush bracket 8 to the adjustment socket 222. Although two legs 9 are shown, it is contemplated that any number of legs 9 could be used by the crush bracket 8.

In use, the crush bracket 8 dissipates energy encountered during an impact against a front surface of the rearview element 10 by compressing at least 1.0 mm without breaking the rearview element 10. Preferably, the crush bracket 8 compresses as the front surface of the rearview element is subjected to a force against the front surface of the rearview element 10. The crush bracket 8 will compress at least under a force equal to or greater than 400 N (90 pounds) in any direction that is not more than 45° from a forward longitudinal direction of motion of a vehicle having the rearview assembly 2 connected thereto, without the rearview assembly 2 being removed from the windshield. It is contemplated, however, that the crush bracket 8 could crush when subjected to a force less than 400 N. Furthermore, once the crush bracket 8 is fully crushed, the rearview assembly will disconnect from the windshield if the force against the front surface of the rearview element is equal to or greater than 400 N (90 pounds) in any direction that is not more than 45° from a forward longitudinal direction of motion of a vehicle having the rearview assembly 2 connected thereto.

Figure 15:
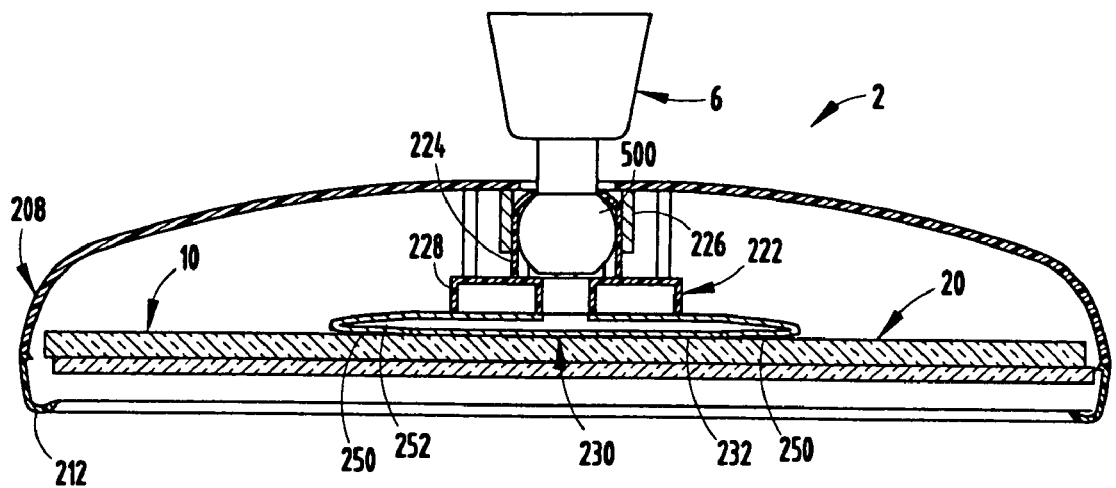
FIG. 15 is a top cross-sectional view of the rearview assembly of the first embodiment of the present invention with the crush bracket in a compressed condition.

In the illustrated example, the crush bracket 8 crushes by having the legs 9 of the crush bracket 8 compress such that the first leg portion 250 of the legs 9 move towards the second leg portion 252, thereby dissipating the energy encountered during the impact against the front surface of the rearview element 10 (see FIG. 15). Preferably, the crush bracket 8 is made of aluminum. Furthermore, the crush bracket 8 preferably non-elastically compresses. Moreover, closed cell foam 260 is preferably positioned between the support panel 230 and the flanges 234 of the end of the legs 9 to dissipate energy encountered during compression of the crush bracket 8.

The illustrated bezel 212 and rear housing member 208 of the housing surrounds the rearview element 10. The crush bracket 8 allows direct mounting of the rearview element 10 to the adjustment socket 222 and/or the ball 500 of the mount 6. Prior rearview mirror assemblies included specially configured housings that had to not only house the mirror element and the electrical components, but which also had to provide the mechanism for attachment to the mount. Thus, the housing previously was made of a rigid plastic and was configured with a number of interior support ribs to provide adequate support to the rearview element while minimizing vibration of the rearview element. Further, housings have been constructed in two-part assemblies including the rear housing member 208 and the bezel 212 that extends around the sides and front edges of the rearview element. This prior two-part housing thus required various clips and couplings to allow the bezel to be secured to the casing.

By mounting the crush bracket 8, the adjustment socket 222, the ball 500, or a flat plate 232 to the rearview element 10, a one-piece housing that is merely decorative may be employed thereby reducing the cost and complexity of the rearview assembly 2. Further, regardless of whether a one- or two-piece housing is employed, the housing may be simplified by eliminating the need for the housing to provide support for the rearview element 10. As illustrated in FIG. 14A, since the rearview element 10 is maintained in position by being connected to the rearview element support assembly 4 as discussed above, the bezel 212 can be separated from the rearview element 10. Therefore, the housing is not needed to maintain the rearview element 10 in position within the housing. However, it is contemplated that the bezel 212 could contact a peripheral edge of the rearview element 10 or could include an element, such as an elastomer, contacting the peripheral edge of the rearview element 10.

The reference numeral 2a (FIG. 14B) generally designates another embodiment of the present invention, having a second embodiment for the rearview assembly. Since rearview assembly 2a is similar to the previously described rearview assembly 2, similar parts appearing in FIGS. 1–14A and FIG. 14B, respectively, are represented by the same, corresponding reference number, except for the suffix "a" in the numerals of the latter. The rearview assembly 2a is similar to the first embodiment of the rearview assembly 2, except that the crush bracket 8*a* includes first resilient fingers 280 and second resilient fingers 282 extending therefrom.

In the illustrated embodiment, direct electronic components placed onto the first substrate 12 helps the electronic components dissipate heat, which is an advantage to the electronics. However, prolonged heating of the electrochromic medium 18 could potentially become high enough, and long enough, to discolor or otherwise degrade the electrochromic medium 18. There is also concern that localized heating could change the clearing rate of the electrochromic medium 18 thereby leading to an undesirable appearance during fast changes in darkening level. Several concepts have been devised addressing this basic heating concern.

This first category of solutions is to dissipate the heat in a way that avoids localized heating to high enough temperatures to cause concern. Heat is generated in two types of electronic components, resistors and active electronics where the output stages are located (heat emitting components 288). If the electronic components that generate heat are spread out enough, the temperature at any one heated region of the rearview element 10 will be lower and there will be less difference to cause visual effects.

Heat from a resistor can be spread out by making the resistor very long or by achieving the desired resistance from several smaller resistors connected in series or parallel. A very long and cost-effective resistor can be made by creating the resistor on the glass using a relatively long length conductive tracing 150*c* (FIG. 2) of resistive material such as a conductive ink, conductive epoxy, or coated metals. By making the resistive tracing long, the area of the glass heated by the resistor can be relatively large and thus the generated heat is spread over a large area of the rearview element. The trace pattern could be wavy to increase the length of the resistor and the area of the rearview element through which heat is dissipated. Active devices may also be fabricated on the glass, such as TFT or organic MOSFETs.

Heat from the resistors and/or the output devices can also be dissipated away from the first substrate 12 by metal objects acting like heat sinks. According to the embodiment shown in FIG. 14B, the crush bracket 8*a* of the rearview assembly 2*a* may comprise a relatively large metal support panel 230*a* for securing the rearview element 10*a* to the mount 6*a* via the adjustment socket 222*a*. By utilizing an appropriate heat transfer means, metal crush bracket 8*a* can also act as a heat sink. One possible means is that the first fingers 280 would contact the heat generating devices 284. Heat would then be able to flow out these fingers 280. Being mechanically compliant, these fingers 280 can be pressed against the devices and yet allow the other fingers 280 or mounting details to predictably mount to the first substrate 12 in other regions. In the embodiment shown in FIG. 14A, a support panel 230*a* of the crush bracket 8*a* is secured to the rear surface 12*b* using an adhesive or double-sided tape. The adhesive preferably has a high thermal conductivity and no electrical conductivity such that the adhesive may be applied directly over the tracings, and preferably over any elongated tracings serving as resistors. Alternatively, a thin layer of an electrically nonconductive material may first be applied over the tracings such that the adhesive need not be electrically nonconductive.

By locating the heat-generating electrical components near the edge of the glass substrate 12, heat can be dissipated by metal or heat conducting edge contacts. Being at the very edge, the heated regions would impact a smaller visual area and less of the electrochromic medium.

The exact opposite, by locating the heat generating electronic components near the center of the rearview element, it is also possible to dissipate heat since a heat sink, such as the crush bracket 8*a* or some other metal structure, may spread and dissipate the heat. Being in the center of the rearview element, the greatest possible area with the shortest possible paths is possible. If the metal layer forming the tracings 150*c* is provided in the center of the rearview element or if a metal component is attached to the glass substrate 12 to transfer heat throughout this central region, the peak temperature at any particular location can be lowered. The visual side effects of central heating of the electrochromic element are the inverse of the effects known from limited surface conduction. Specifically, some existing electrochromic rearview elements may experience delayed clearing or darkening of the center region due to the distance of the central region from the conductive clips attached to the perimeter of the rearview element. Thus, heating of the center of the electrochromic rearview element would advantageously speed up the clearing or darkening of the center of the electrochromic rearview element thereby compensating for this otherwise inherent delay.

Another basic approach to reduce the effects of heat on an electrochromic rearview element is to reduce the heat generated by the electronic components. Under this concept, one option emerges as the most preferred. Some existing electrochromic mirror drive control circuits lower the nominal 12-volt supply voltage to about 1.2 volts or less for application to the electrochromic rearview element. By using an efficient switching power supply 86 to initially lower the nominal 12 volts to 5 volts, the heat generated by the drive circuit 24 is greatly reduced. Further, since 5 volts is a popular voltage for electronics, the cost of this supply can be justified by these other possible needs.

Yet another way to avoid heat is to design the output stage for one condition such as only for use with an inside electrochromic rearview element. This allows the best efficiency and lower heating.

Another way to address heating is change the nature of the electrochromic chemistry. If the current required to darken and/or hold the dark state of the particular electrochromic medium is reduced, the current flowing through the electronics can be reduced and hence the heat generated by the electronics can be reduced. Examples of electrochromic elements having reduced current requirements are disclosed in U.S. Pat. No. 6,710,906, entitled "CONTROLLED DIFFUSION COEFFICIENT ELECTROCHROMIC MATERIALS FOR USE IN ELECTROCHROMIC MEDIUMS AND ASSOCIATED ELECTROCHROMIC DEVICES," the entire disclosure of which is incorporated herein by reference. There are also electrochromic elements that do not require current to maintain the element in a darkened state. Use of such electrochromic rearview elements would virtually eliminate heat generated to drive the rearview element.

Figure 14B:
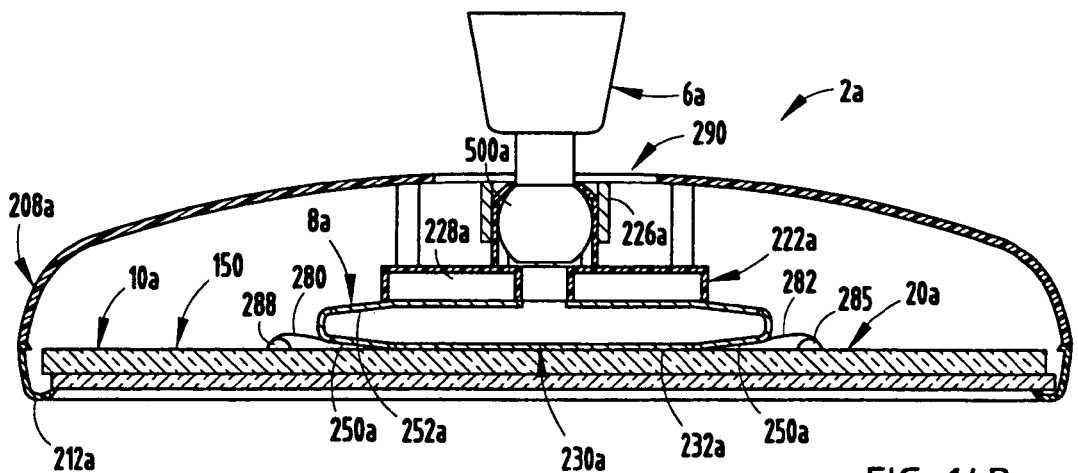
FIG. 14B is a top cross-sectional view of a second embodiment of the rearview assembly with the crush bracket in the uncompressed condition and including resilient fingers.
Figure 14C:
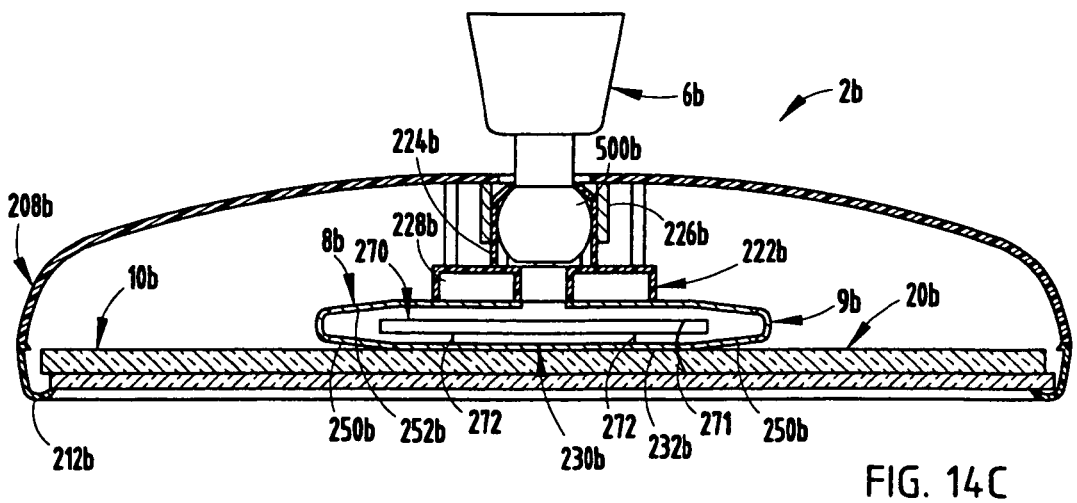
FIG. 14C is a top cross-sectional view of a third embodiment of the rearview assembly with the crush bracket in the uncompressed condition and including a circuit board.
Figure 14D:
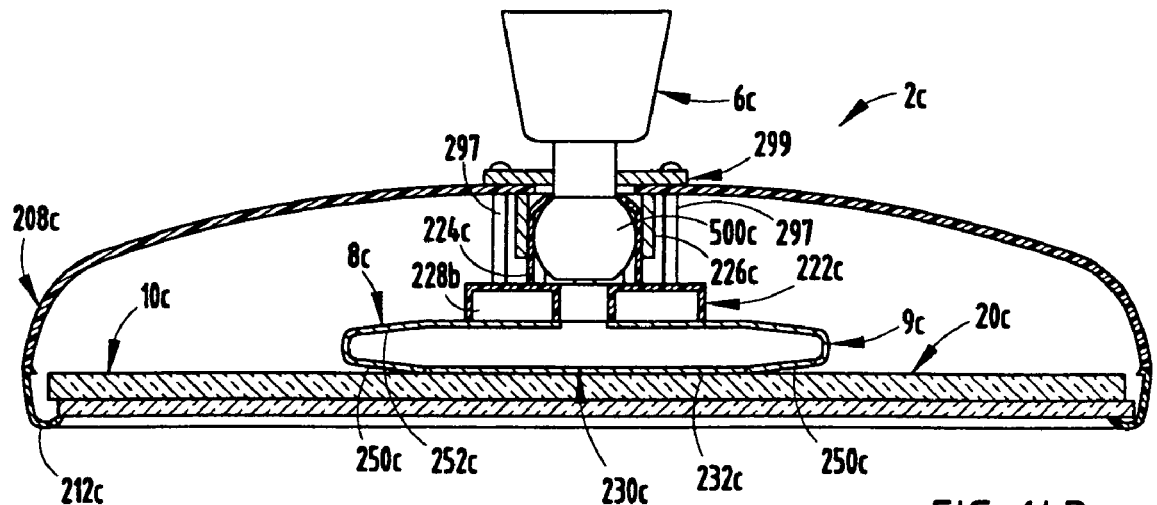
FIG. 14D a top cross-sectional view of a fourth embodiment of the rearview assembly with the crush bracket in the uncompressed condition.
Figure 14E:
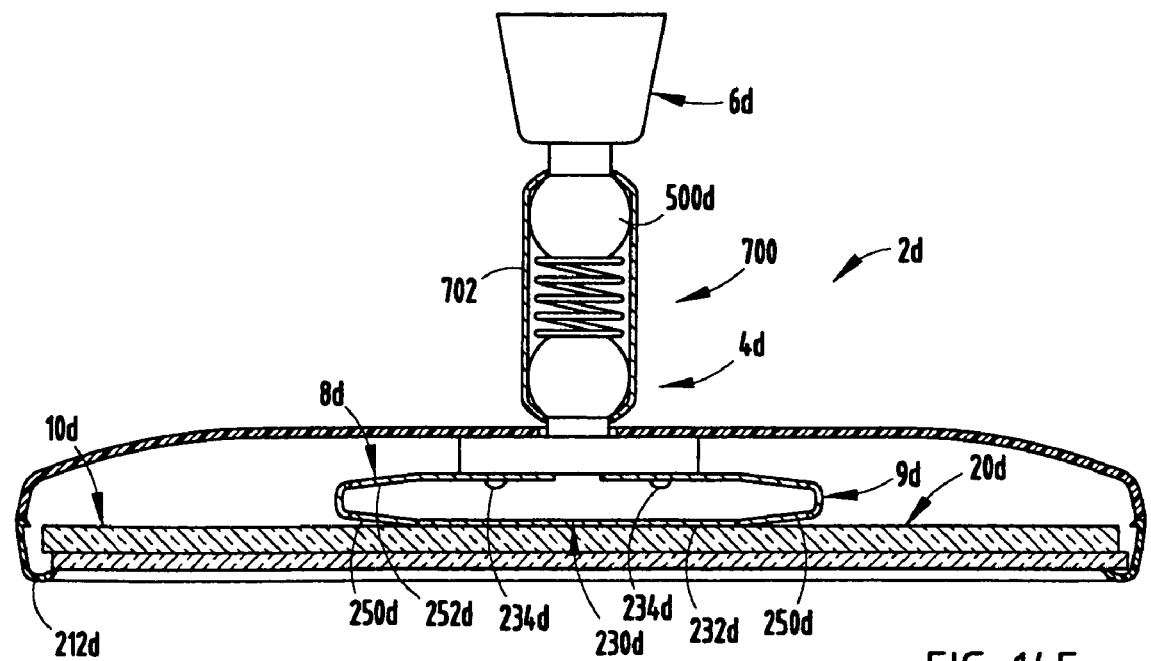
FIG. 14E a top cross-sectional view of a fifth embodiment of the rearview assembly having a double ball system and with the crush bracket in the uncompressed condition.

As also illustrated in FIG. 14B, the tracings 150 could include an electrically conductive component 285. The second fingers 282 of the crush bracket 8*a* can contact the electrically conductive component 285 to provide a ground for the electrically conductive component 285. Preferably, the first fingers 280 and the second fingers 282 are resilient and press against the heat emitting component 288 and the electrically conductive component 285. Although the first fingers 280 and the second fingers 282 are illustrated as being pressed against the heat emitting component 288 and the electrically conductive component 285 on the rearview element 10*a*, it is contemplated that the first fingers 280 and the second fingers 282 can be pressed against heat emitting components and the electrically conductive components on a printed circuit board within the rearview assembly 2 when the circuit 20 is not on the rearview element 10 as discussed below. It is contemplated that any of the embodiments of the rearview assembly 2 having the crush plate 8 as described herein could include the first fingers 280 and the second fingers 282.

With reference to FIG. 14A, the rear housing member 208a includes an enlarged rear opening 290. The enlarged rear opening 290 allows the rearview assembly 2a to be constructed by first connecting the rearview element support assembly 4a and the rearview element 10a together and then connecting the mount 6a to the rearview element support assembly 4a, without connecting the housing. Thereafter, the rear housing member 208a can be slid over both the mount 6a and a portion of the rearview element support assembly 4a to connect the rear housing member 208a to the rearview assembly 2a because the rear housing member 208 does not have to be used to support the rearview element 10a. Thereafter, the bezel 212a can be connected to the rear housing member 208a to complete the rearview assembly 2a. It is contemplated that any of the embodiments of the rearview assembly 2 having the crush plate 8 as described herein could include the enlarged rear opening 290 in the rear housing member 208 to construct the rearview assembly 2 as described directly above.

The reference numeral 2b (FIG. 14C) generally designates another embodiment of the present invention, having a third embodiment for the rearview assembly. Since rearview assembly 2b is similar to the previously described rearview assembly 2, similar parts appearing in FIGS. 1–14A and FIG. 14C, respectively, are represented by the same, corresponding reference number, except for the suffix "b" in the numerals of the latter. The rearview assembly 2b is similar to the first embodiment of the rearview assembly 2, except that the rearview element 10b does not include the circuitry 20 thereon. Instead, the circuitry is located on a printed circuit board 270 as is well known to those skilled in the art. The support panel 230b of the crush bracket 8b includes supports 272 extending from a rear surface thereof configured to be connected to the printed circuit board 270 to connect the printed circuit board 270 of the crush bracket 8b. The printed circuit board 270 is electronically connected to the electrochromic rearview element 10b as is well known to those skilled in the art (e.g., a jump wire 271) to control the reflectivity of the electrochromic rearview element 10b as discussed above.

The reference numeral 2c (FIG. 14D) generally designates another embodiment of the present invention, having a fourth embodiment for the rearview assembly. Since rearview assembly 2c is similar to the previously described rearview assembly 2, similar parts appearing in FIGS. 1–14A and FIG. 14D, respectively, are represented by the same, corresponding reference number, except for the suffix "c" in the numerals of the latter. The rearview assembly 2c is similar to the first embodiment of the rearview assembly 2, except that the rearview assembly 2c includes an additional connection ring 299 configured to be connected to the adjustment socket 222c by fasteners 297 extending through the rear housing member 208c to thereby capture the rear housing member 208c between the adjustment socket 222c and the connection ring 299.

The reference numeral 2d (FIG. 14E) generally designates another embodiment of the present invention, having a fifth embodiment for the rearview assembly. Since rearview assembly 2d is similar to the previously described rearview assembly 2, similar parts appearing in FIGS. 1–14A and FIG. 14E, respectively, are represented by the same, corresponding reference number, except for the suffix "d" in the numerals of the latter. The rearview assembly 2d is similar to the first embodiment of the rearview assembly 2, except that the rearview assembly 2d includes a double ball system 700. The double ball system 700 (rearview element support assembly 4d) includes a first ball 702 connected to the flanges 234d of the crush bracket 8d and a sleeve 704 extending over the first ball 702 and the ball 500d of the mount 6d. An example of a rearview assembly including a mount having a double ball mounting system is disclosed in U.S. Pat. No. 5,377,948 entitled "BREAKAWAY REARVIEW MIRROR MOUNTING BRACKET," the entire contents of which are hereby incorporated herein by reference. It is contemplated that the double ball system could be used with any of the rearview assemblies disclosed herein.

Figure 16:
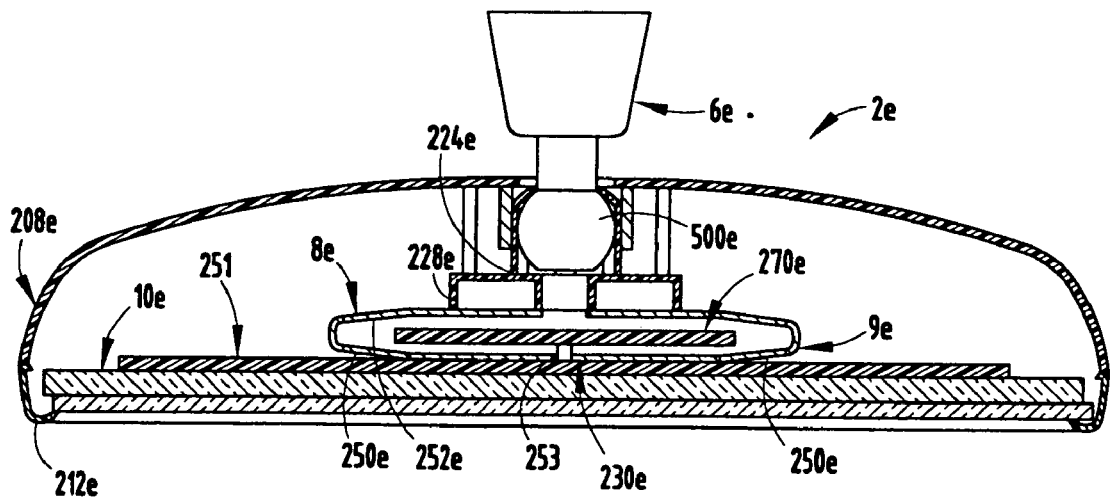
FIG. 16 is a top cross-sectional view of a sixth embodiment of the rearview assembly having a support plate and with the crush bracket in the uncompressed condition.

The reference numeral 2e (FIG. 16) generally designates another embodiment of the present invention, having a sixth embodiment for the rearview assembly. Since rearview assembly 2e is similar to the previously described rearview assembly 2b, similar parts appearing in FIG. 14C and FIG. 16, respectively, are represented by the same, corresponding reference number, except for the suffix "e" in the numerals of the latter. The rearview assembly 2e is similar to the third embodiment of the rearview assembly 2c wherein the rearview element 10e does not include the circuitry 20 thereon. The circuitry is located on a printed circuit board 270e as is well known to those skilled in the art. However, the printed circuit board 270e is connected to a carrier plate 251 supporting the rearview element 10e. The carrier plate 251 preferably includes double-sided adhesive tape on both sides thereof for connection to the rearview element 10e and the crush bracket 8e. An example of a rearview assembly including a carrier plate and a circuit board is disclosed in U.S. Pat. No. 6,239,899, entitled "MIRROR WITH INTERNAL SUPPORT PLATE," the entire contents of which are hereby incorporated herein by reference. The carrier plate 251 preferably includes a pair of supports 253 extending above and below the support panel 230e of the crush bracket 8e for supporting the printed circuit board 270e.

Figure 17A:
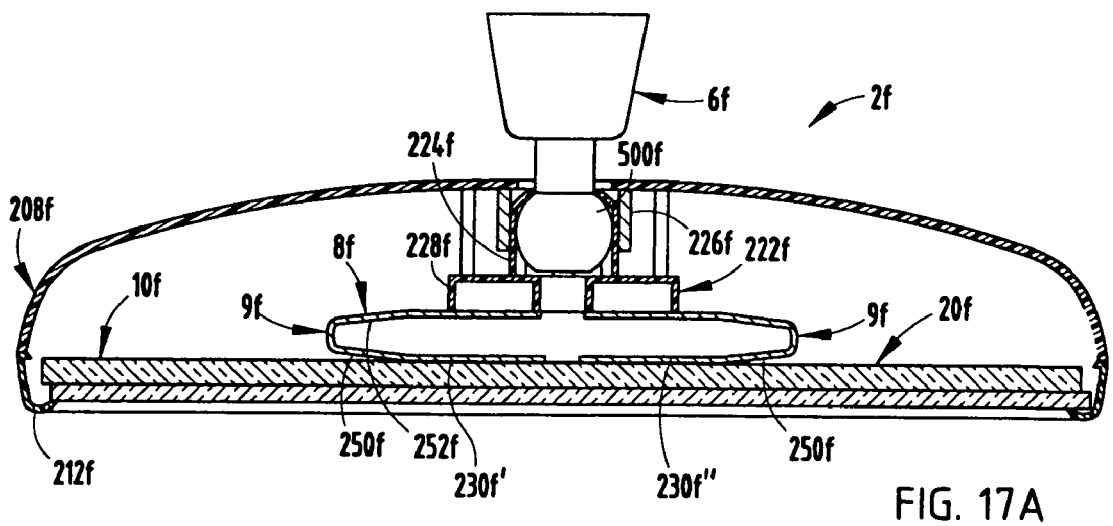
FIG. 17A is a top cross-sectional view of a seventh embodiment of the rearview assembly with a split crush bracket in an uncompressed condition.

The reference numeral 2f (FIG. 17A) generally designates another embodiment of the present invention, having a seventh embodiment for the rearview assembly. Since rearview assembly 2f is similar to the previously described rearview assembly 2, similar parts appearing in FIGS. 1–14A and FIG. 17A, respectively, are represented by the same, corresponding reference number, except for the suffix "f" in the numerals of the latter. The rearview assembly 2a is similar to the first embodiment of the rearview assembly 2, except that the support panel 230f of the crush bracket 8f includes two separate portions 230f' and 230f''.

Figure 17B:
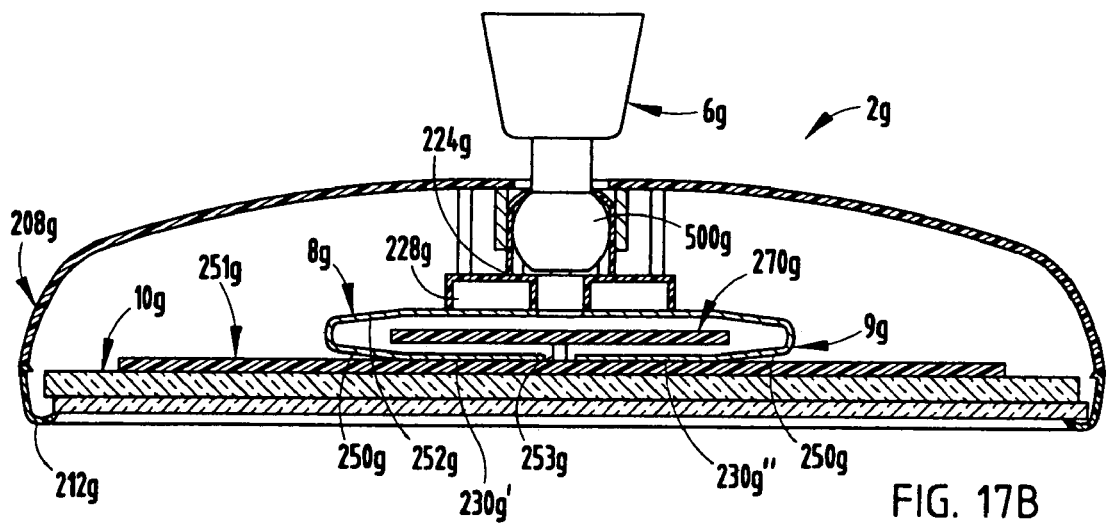
FIG. 17B is a top cross-sectional view of an eighth embodiment of the rearview assembly with a support plate and a split crush bracket in an uncompressed condition.

The reference numeral 2g (FIG. 17B) generally designates another embodiment of the present invention, having an eighth embodiment for the rearview assembly. Since rearview assembly 2g is similar to the previously described rearview assembly 2e, similar parts appearing in FIG. 16 and FIG. 17B, respectively, are represented by the same, corresponding reference number, except for the suffix "g" in the numerals of the latter. The rearview assembly 2g is similar to the first embodiment of the rearview assembly 2e, except that the support panel 230g of the crush bracket 8g includes two separate portions 230g' and 230g''.

The reference numeral 2h (FIG. 17C) generally designates another embodiment of the present invention, having a ninth embodiment for the rearview assembly. Since rearview assembly 2h is similar to the previously described rearview assembly 2, similar parts appearing in FIGS.

Figure 17C:
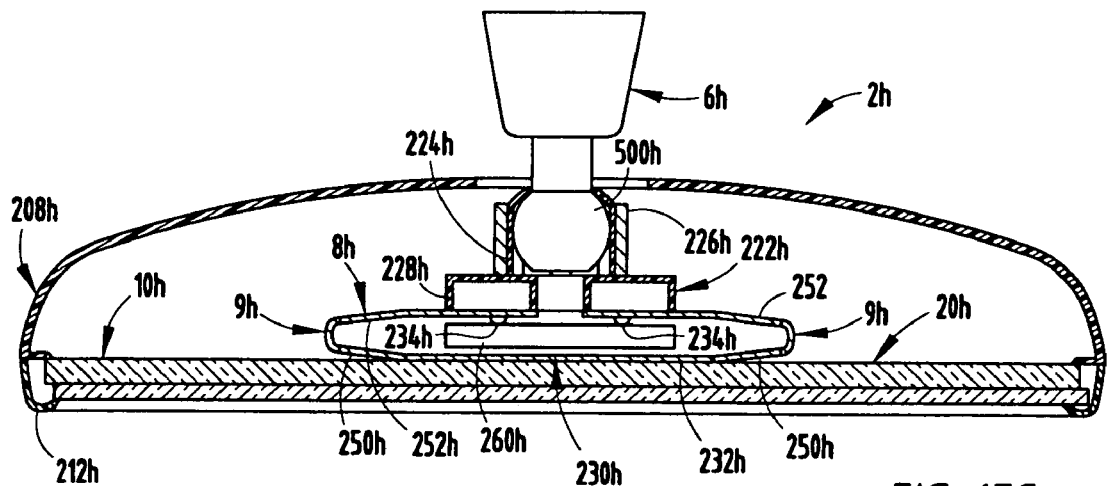
FIG. 17C is a top cross-sectional view of a ninth embodiment of the rearview assembly having a housing supported by a reflective element and the crush bracket in an uncompressed condition.

1–14A and FIG. 17C, respectively, are represented by the same, corresponding reference number, except for the suffix "h" in the numerals of the latter. The rearview assembly 2h is similar to the first embodiment of the rearview assembly 2, except that the rear housing member 208h and the bezel 212h are supported by the reflective element 10h instead of being supported by the mount 6, ball 500 and/or adjustment socket 222. As described above, the housing of the rearview assembly includes the rear housing member 208h and the bezel 212h. In the ninth embodiment of the rearview assembly 2h, the rear housing member 208h and the bezel 212h capture the reflective element 10h therebetween as the rear housing member 208h and the bezel 212h are connected together (e.g., snap fit together). Therefore, the housing can be added to the rearview assembly 2h after the mount 6h has been connected to the adjustment socket 222h, the crush bracket 6h and the reflective element 10h. It is contemplated that the rear housing member 208h could include the rear opening 290h that surrounds the mount 6h such that the rear housing member 208h is slid over the ball 500h as the mount 6h is connected to the adjustment socket 222. Alternatively, it is contemplated that the rear housing member 208h could have a slot such that the rear housing member 208h can be slid over the mount 6h after the mount 6h has been connected to the adjustment socket 222 (and thereafter connected to the bezel 212h to thereby support the rear housing member 208h from the mount 6h via the reflective element 10h). While the rear housing member 208h is illustrated as being spaced from the stem of the mount 6h, it is contemplated that the rear housing member 208h could abut the stem or could include an elastic pad or member that abuts the stem. Furthermore, while the rearview assembly 2h is disclosed as using the crush bracket 6h, it is contemplated that the reflective element 10h could be connected to an integral plate frame (carrier plate), such as that disclosed in U.S. application Ser. No. 10/405,526 entitled REARVIEW MIRROR WITH INTEGRATED FRAME, the entire contents of which are hereby incorporated herein by reference.

Figure 17D:
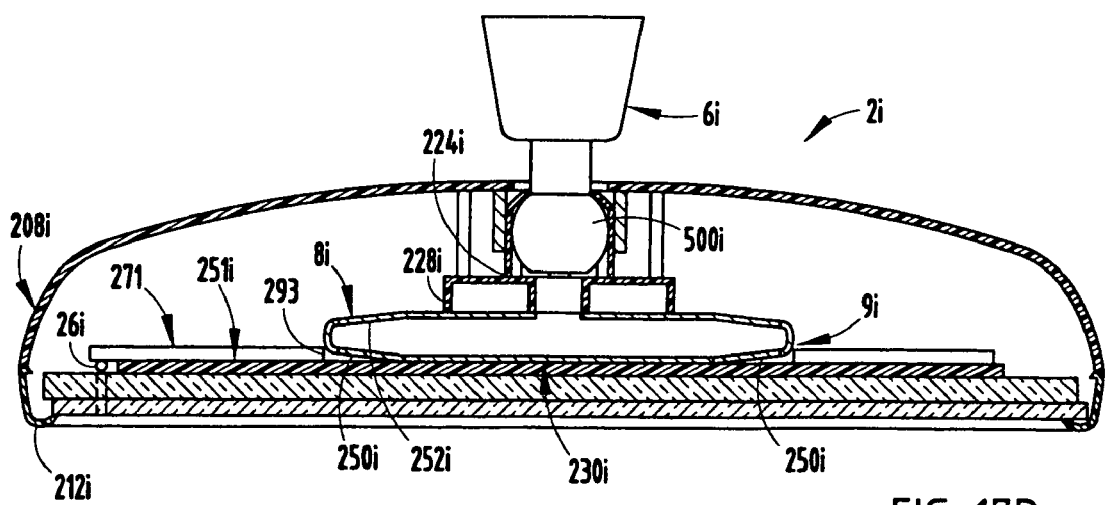
FIG. 17D is a top cross-sectional view of a tenth embodiment of the rearview assembly having a crush bracket extending through a circuit board and in an uncompressed condition.

The reference numeral 2i (FIG. 17D) generally designates another embodiment of the present invention, having a tenth embodiment for the rearview assembly. Since rearview assembly 2i is similar to the previously described sixth embodiment of the rearview assembly 2e, similar parts appearing in FIG. 16 and FIG. 17D, respectively, are represented by the same, corresponding reference number, except for the suffix "i" in the numerals of the latter. The rearview assembly 2i is similar to the sixth embodiment of the rearview assembly 2e, except that the circuit board 271i is connected to a rear of the carrier plate 251i and the crush bracket 8i extends through an opening 293 in the circuit board 271i instead of the circuit board being located within the crush bracket. In the illustrated embodiment, the circuit board 271i includes a glare sensor 26i for sensing glare and reducing the reflectivity of the reflective element 10i as described above.

In all of the above embodiments of the rearview assembly 2-2i, the features that are not mutually exclusive can be used in any of the embodiments. For example, the two piece crush bracket can be used in any embodiment. Furthermore, the housing can be supported through the reflective element or through the mount in any embodiment unless specifically noted otherwise. Furthermore, all embodiments can include foam 260 within the crush bracket. Likewise, all of the embodiments of the rearview assembly can be either a one ball or two ball system and can include the resilient fingers 280 or 282.

Additional Concepts

The present invention has been described as incorporating various electronic components within the housing of a rearview assembly. It will be appreciated by those skilled in the art that various other vehicle accessories and components may be incorporated in the rearview assembly in whole or in part and in various combinations. Such vehicle accessories and components may be mounted within, on or to the housing, the mount, an attachment to the mount or housing, or in a console or other housing associated with the rearview assembly. Additionally, any such vehicle accessories may share components with one another, such as processors, sensors, power supplies, wire harnesses and plugs, displays, switches, antennae, etc. Examples of such vehicle accessories, components or features are described further below.

Figure 18A:
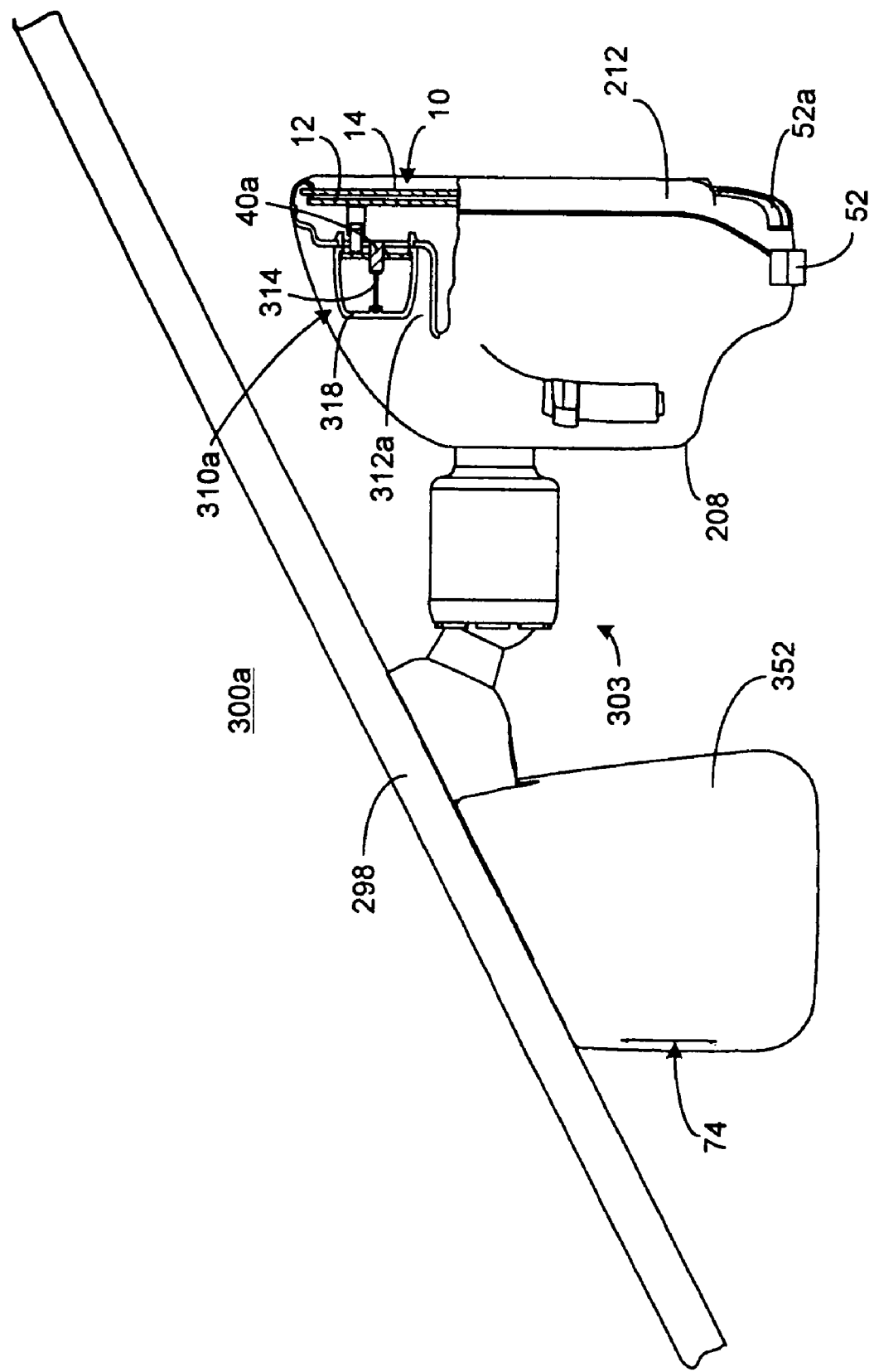
FIG. 18A is an elevational side view of a rearview assembly incorporating the rearview element of the present invention.
Figure 18B:
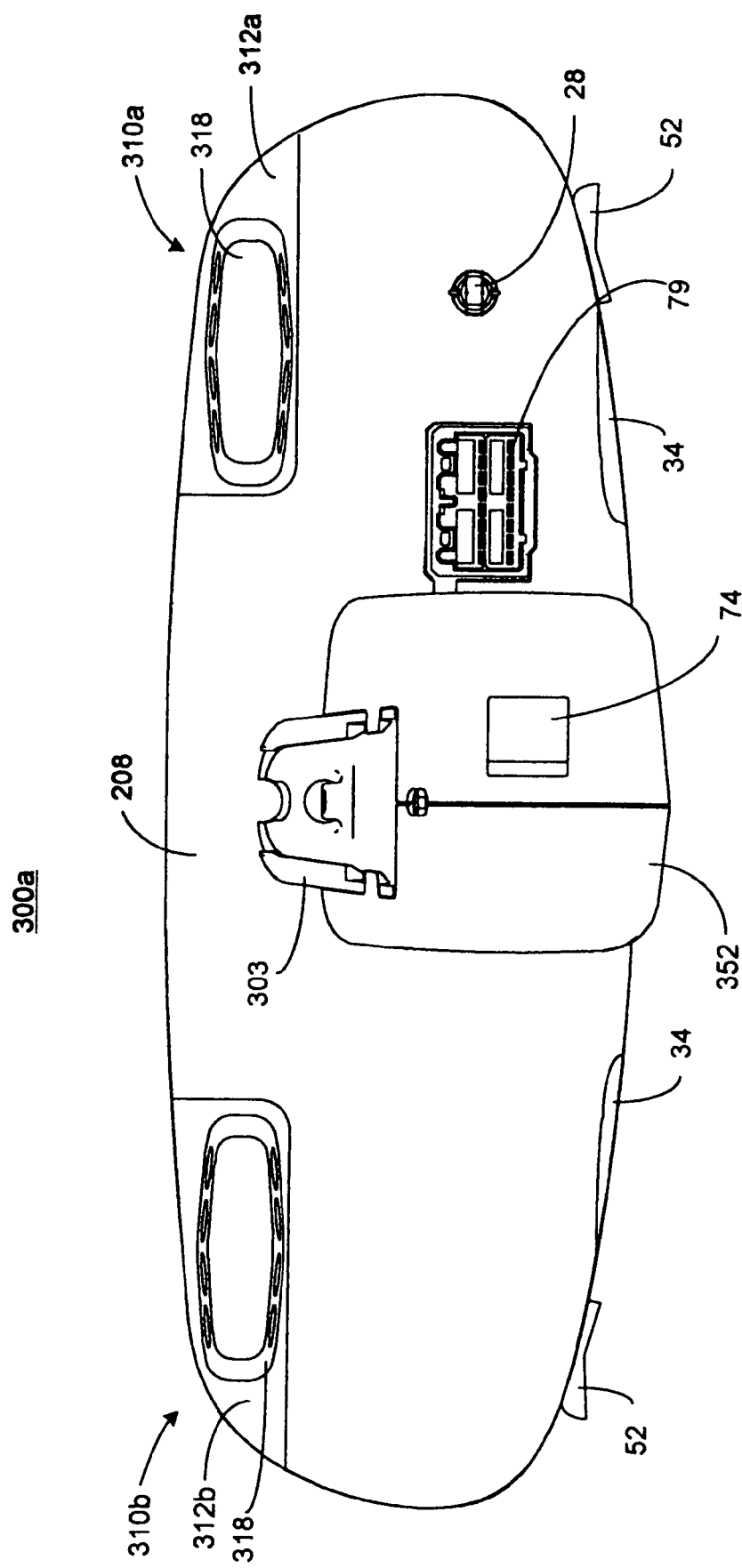
FIG. 18B is an elevational view of the rear of the rearview assembly shown in FIG. 18A.
Figure 18C:
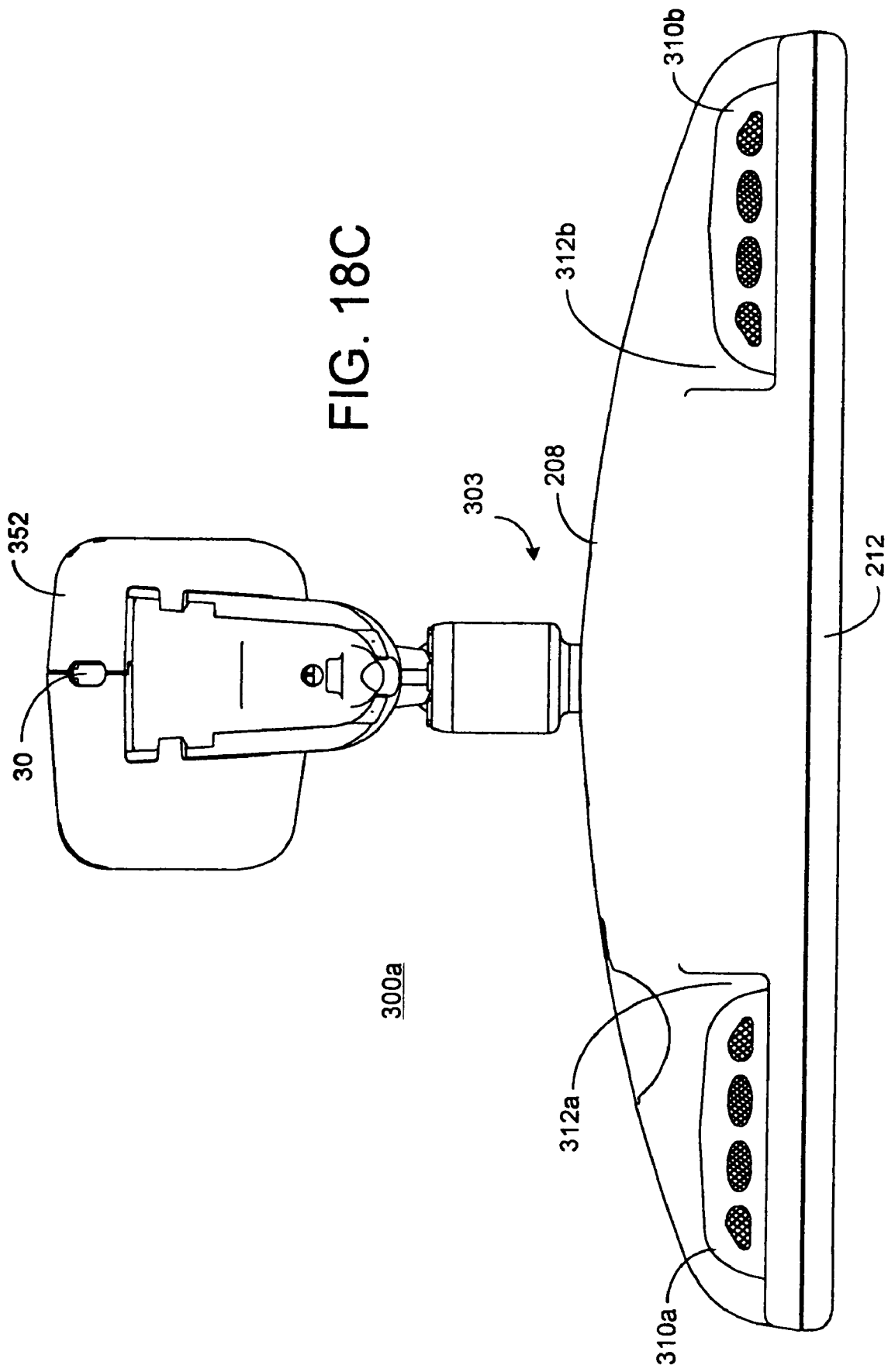
FIG. 18C is a plan view of the top of the rearview assembly shown in FIG. 18A.

FIGS. 18A through 18C show another embodiment of a rearview assembly 300a in which any of the above-described electronic compass systems are incorporated. As illustrated in FIGS. 18A through 18C, the mirror assembly 300a comprises the bezel 212 and the rear housing member 208. The bezel 212 and the rear housing member 208 combine to define the housing for incorporation of features in addition to a rearview element 10 and information displays 36a and 36b. Commonly assigned U.S. Pat. Nos. 6,102,546, D410,607, 6,407,468, 6,420,800, and 6,471,362, the disclosures of which are incorporated in their entireties herein by reference, describe examples of various bezels, cases and associated button constructions that may be used with the present invention.

Figure 19A:
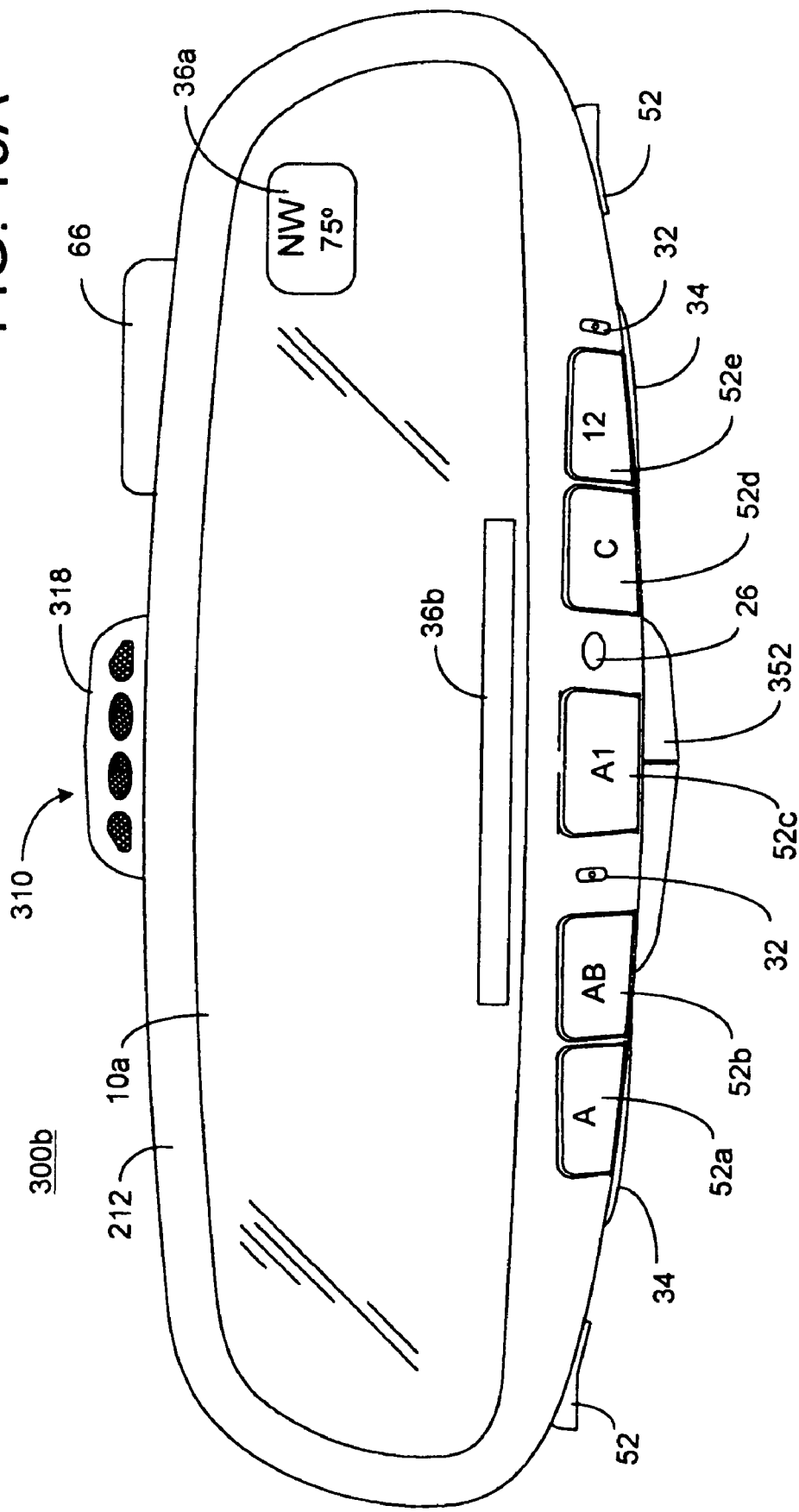
FIG. 19A is an elevational view of the front of another rearview assembly that may incorporate the rearview element of the present invention.

As depicted in FIGS. 18A–18C, the rearview assembly may comprise first and second microphones 310a and 310b. Examples of microphones for use with the present invention are described in commonly assigned U.S. patent application Ser. No. 09/444,176, U.S. Pat. No. 6,614,911, U.S. Patent Application Publication No. US 2002/0110256 A1, and PCT Application No. PCT/US02/32386, the disclosures of which are incorporated in their entireties herein by reference. Although the two microphones are shown as being mounted to the backside of rear housing member 208, one or more such microphones may be mounted on the top of the mirror assembly (as shown in FIGS. 19A and 19B), on the bottom of the rearview assembly, or any where within the rear housing member or bezel. Preferably, two microphones 310a and 310b are incorporated, one near each end, into the rearview assembly on the backside of the rear housing member 208 within recessed portions 312a and 312b. As shown in FIG. 18A, the microphones are constructed with an acoustic dam 314 extending around transducer 40a within a microphone housing 318. Additional details of this preferred construction are disclosed in commonly-assigned International PCT Application No. PCT/US02/32386, the entire disclosure of which is incorporated herein by reference. The audio systems including the microphones may be integrated, at least in part, in a common control with information displays and/or may share components with the information displays. In addition, the status of these systems and/or the devices controlled thereby may be displayed on the associated information displays.

As shown in FIGS. 19A and 19B, a single microphone 310 is provided on the top side of the rearview assembly 300b. In this construction, it is preferable to include two transducers in microphone housing 318 in a manner similar to that disclosed in the above-referenced International PCT Application No. PCT/US02/32386 and U.S. Pat. No. 6,882,734.

The rearview assembly 300b may include first and second illumination assemblies 34. Various illumination assemblies and illuminators for use with the present invention are described in commonly assigned U.S. Pat. Nos. 5,803,579, 6,335,548, 6,441,943, 6,521,916, 6,523,976, 6,670,207 and 6,805,474, as well as commonly assigned U.S. patent application Ser. No. 09/723,675, the disclosures of which are incorporated in their entireties herein by reference. Each illumination assembly preferably comprises a reflector, a lens and a light source 34 (FIG. 2). There may be two illumination assemblies generally positioned to illuminate a front passenger seat area and the second generally positioned to illuminate a driver seat area. Alternatively, there may be only one illumination assembly that illuminates both seat areas and/or there may be additional illuminator assemblies such as one to illuminate a center console area, overhead console area or an area between the front seats.

The rearview assembly 300b may also include first and second switches 52. Suitable switches for use with the present invention are described above and are described in detail in commonly assigned U.S. Pat. Nos. 6,407,468, 6,420,800, 6,426,568, 6,614,579, and 6,471,362, the disclosures of which are incorporated in their entireties herein by reference. These switches may be incorporated to control the illumination assemblies, the displays, the mirror reflectivity, a voice activated system, a compass system, a telephone system, a highway toll booth interface, a telemetry system, a headlight controller, a rain sensor, a tire pressure monitoring system, a navigation system, a lane departure warning system, an adaptive cruise control system, etc. Any other display or system described herein or within the references incorporated by reference may be incorporated in any location within the associated vehicle and may be controlled using the switches.

The rearview assembly 300b may also include first and second indicators 32. Various indicators for use with the present invention are described in commonly assigned U.S. Pat. Nos. 5,803,579, 6,335,548, 6,441,943, 6,521,916, 6,523,976, 6,670,207 and 6,805,474, as well as commonly assigned U.S. patent application Ser. No. 09/723,675, the entire disclosures of which are incorporated herein by reference. These indicators may indicate the status of the displays, the mirror reflectivity, a voice activated system, a compass system, a telephone system, a highway toll booth interface, a telemetry system, a headlight controller, a rain sensor, a security system, a rear parking aid, etc. Any other display or system described herein or within the references incorporated by reference may be incorporated in any location within the associated vehicle and may have a status depicted by the indicators.

The rearview assembly 300b may further include first and second light sensors 26 and 28 serving as glare and ambient sensors, respectively. Preferred light sensors for use within the present invention are described in detail in commonly assigned U.S. Pat. Nos. 5,923,027, 6,313,457, 6,359,274, 6,379,013, 6,402,328, 6,679,608 and 6,831,268, the entire disclosures of which are incorporated herein by reference. The glare sensor 26 and/or ambient sensor 28 automatically control the reflectivity of a self-dimming reflective rearview element as well as the intensity of information displays and/or backlighting. The glare sensor 26 may also be used to sense headlights of trailing vehicles and the ambient sensor is used to detect the ambient lighting conditions that the system is operating within.

The electrical output signal from either, or both, of the sensors 26 and 28 may be used as inputs to a controller (not shown) to control the reflectivity of rearview element 10a and/or, the intensity of any one or all of the displays 36a and 36b. The details of various control circuits for use herewith are described in commonly assigned U.S. Pat. Nos. 5,883, 605, 5,956,012, 6,084,700, 6,222,177, 6,224,716, 6,247,819, 6,249,369, 6,392,783 and 6,402,328, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

In another embodiment, a sky sensor 30 may be incorporated positioned to detect light levels generally above and in front of an associated vehicle. The sky sensor 30 may be used to automatically control the reflectivity of a self-dimming element, the exterior lights of a controlled vehicle and/or the intensity of information displays. The rearview assembly may further include sun-load sensors for sensing light levels towards the driver side and passenger side of the vehicle so as to control the climate control system of the vehicle.

Additionally, the rearview assembly 300b may include first, second, third, fourth and fifth operator interfaces 52a–52e located in the bezel 212. Each operator interface is shown to comprise a backlit information display "A," "AB," "A1," "C," and "12." It should be understood that these operator interfaces can be incorporated anywhere in the associated vehicle, for example, in the housing, accessory module, instrument panel, overhead console, dash board, seats, center console, etc. Suitable switch construction is described in detail in commonly assigned U.S. Pat. Nos. 6,407,468, 6,420,800, 6,426,568, 6,614,579, and 6,471,362, the disclosures of which are incorporated in their entireties herein by reference. These operator interfaces may control the illumination assemblies, the displays, the mirror reflectivity, a voice activated system, a compass system, a telephone system, a highway toll booth interface, a telemetry system, a headlight controller, a rain sensor, a tire pressure monitoring system, a navigation system, a lane departure warning system, an adaptive cruise control system, etc. Any other display or system described herein or within the references incorporated by reference may be incorporated in any location within the associated vehicle and may be controlled using an operator interface or interfaces. For example, a user may program a display or displays to depict predetermined information or may program a display or displays to scroll through a series of information, or may enter set points associated with certain operating equipment with associated sensor inputs to display certain information upon the occurrence of a given event. In one embodiment, for example, a given display may be in a non-illuminated state until the engine temperature is above a threshold, the display then automatically is set to display the engine temperature. Another example is that proximity sensors located on the rear of a vehicle may be connected to a controller and combined with a display in a rearview element to indicate to a driver the distance to an object; the display may be configured as a bar that has a length proportional to the given distance.

Although specific locations and numbers of these additional features are depicted in FIGS. 18A–18C and 19A and 19B, it should be understood that fewer or more individual devices may be incorporated in any location within the associated vehicle and as described within the references incorporated herein.

A mount 303 is included for mounting the rearview assembly within a vehicle either to windshield 298, or to the vehicle roof structure. It should be understood that a host of accessories may be incorporated into the mount 303 or into a housing 352 attached to mount 303 such as a rain sensor 76, a camera 74, a headlight control, an additional microprocessor, additional information displays, compass sensors, speakers, etc. These systems may be integrated, at least in part, in a common control with information displays and/or may share components with the information displays. In addition, the status of these systems and/or the devices controlled thereby may be displayed on the associated information displays.

Although the compass sensor module 38 is described as being mounted to rear surface 12*b* of substrate 12, it should be understood that the sensor module may be located within the mount 303, an accessory module 352 positioned proximate the rearview assembly 300*a* or 300*b* or at any location within an associated vehicle such as under a dash board, in an overhead console, a center console, a trunk, an engine compartment, etc. The above described compass systems may be integrated, at least in part, in a common control with information displays and/or may share components with the information displays. In addition, the status of these systems and/or the devices controlled thereby may be displayed on the associated information displays.

The compass system further includes a controller, such as a microprocessor 22, and an information display 36*a*. The microprocessor may, for example, receive signal(s) from the compass sensor module 38 and process the signal(s) and transmit signal(s) to display 36*a* to indicate the corresponding vehicle heading. As described herein and within the references incorporated by reference herein, the controller may receive signal(s) from light sensor(s), rain sensor(s) (not shown), automatic vehicle exterior light controller(s) (not shown), microphone(s), global positioning systems (not shown), telecommunication systems (not shown), operator interface(s) and a host of other devices, and control the information display(s) to provide appropriate visual indications.

The compass system described above may include a compass sensor circuit 38 such as the magnetometer circuit disclosed in commonly assigned U.S. Pat. No. 6,653,831, the entire disclosure of which is incorporated herein by reference. As disclosed in commonly assigned U.S. Pat. Nos. 6,023,229, 6,140,933 and 6,968,273, and in U.S. Provisional Patent Application No. 60/449,828, filed on Feb. 24, 2003, the compass sensors 38 may be mounted inside the housing or proximate the mount. Preferably, the microprocessor 22 is programmed in the manner disclosed in U.S. Pat. No. 6,968,273, and in U.S. Provisional Patent Application No. 60/449,828, filed on Feb. 24, 2003, the entire disclosures of which are incorporated herein by reference.

The controller (or controllers) 22 used to control the compass system may, at least in part, control the mirror reflectivity, exterior lights, rain sensor, compass and information displays 36, windshield wipers, heater, defroster, defogger, air conditioning, telephone system, navigation system, security system, tire pressure monitoring system, a garage door opening transmitter, remote keyless entry, telemetry systems, voice recognition systems such as digital signal processor based voice actuation systems, and vehicle speed. The controller (or controllers) may receive signals from switches and or sensors associated with any of the devices described herein and in the references incorporated by reference herein to automatically manipulate any other device described herein or described in the references included by reference. The controller may be, at least in part, located outside the rearview assembly or may comprise a second controller elsewhere in the vehicle or additional controllers throughout the vehicle. The individual processors may be configured to communicate serially, in parallel, via BLUETOOTH™ protocol, wireless communication, over the vehicle bus, such as a CAN bus or a LIN bus, or any other suitable communication link or combination of these links. A multi-pin connector interface may be provided for such external connections.

Exterior light control systems as described in commonly assigned U.S. Pat. Nos. 5,990,469, 6,008,486, 6,130,421, 6,130,448, 6,255,639, 6,049,171, 5,837,994, 6,403,942, 6,281,632, 6,291,812, 6,469,739, 6,465,963, 6,429,594, 6,587,573, 6,611,610, 6,621,616, 6,653,614, 6,861,809, 6,774,988 and 6,379,013, and U.S. Patent Application Nos. 60/404,879, 60/394,583, the entire disclosures of which are incorporated herein by reference, may be incorporated in accordance with the present invention. These systems may be integrated, at least in part, in a common control with information displays and other accessories and/or may share components with the information displays and other accessories. In addition, the status of these systems and/or the devices controlled thereby may be displayed on the associated information displays. As disclosed in U.S. Pat. No. 6,587,573, both the compass sensors 38 and the imaging sensor array 74, may be housed in an accessory housing 352 attached to the mount 303.

Moisture sensors and windshield fog detector systems 76 are described in commonly assigned U.S. Pat. Nos. 5,923,027, 6,617,564, 6,313,457, and 6,681,163, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

Commonly assigned U.S. Pat. No. 6,262,831, the disclosure of which is incorporated herein by reference in its entirety, describes power supplies for use with the present invention. These systems may be integrated, at least in part, in a common control with information displays and/or may share components with the information displays and other accessories. In addition, the status of these systems and/or the devices controlled thereby may be displayed on the associated information displays.

The rearview assembly may further include one or more antennae 62, 64, 66 for receipt and/or transmission of RF signals. Appropriate RF receiving/transmitting circuitry 56, 58, 60, and/or processing circuitry 22 may further be included in or attached to the rearview assembly. Such antennae may be used for a cellular telephone system 58, a BLUETOOTH™ transmitting/receiving system 56, a remote keyless entry (RKE) system, a trainable garage door opener system, a tire pressure monitoring system, a global positioning satellite system, an electronic toll collection (ETC) system, a LORAN system, etc. Some of these systems may share a common antenna and receiving, transmitting, processing, and display circuits 36 where appropriate. Examples of a tire pressure monitoring system incorporated in a rearview mirror assembly are disclosed in commonly assigned U.S. Pat. Nos. 6,215,389, 6,861,942, 6,696,935 and 6,431,712, the entire disclosures of which are incorporated herein by reference. Examples of a GPS system incorporated in a rearview mirror assembly are disclosed in commonly assigned U.S. Pat. Nos. 6,166,698, 6,297,781, 6,396,446 and 6,980,092, the entire disclosures of which are incorporated herein by reference. An example of a LORAN system incorporated in a rearview mirror assembly is disclosed in commonly assigned U.S. Pat. No. 6,539,306, the entire disclosure of which is incorporated herein by reference. An example of both telephone/telematics system and a BLUETOOTH™ system incorporated in a rearview mirror assembly is disclosed in commonly assigned U.S. Pat. No. 6,980,092, the entire disclosure of which is incorporated herein by reference. Examples of a trainable garage door opening systems and RKE systems incorporated in a rearview mirror assembly are disclosed in U.S. Pat. No. 6,091,343, the entire disclosures of which are incorporated herein by reference.

As noted above, the rearview assembly may further include an IR transmitter/receiver 68 for transmitting/receiving information to and from the rearview assembly and possibly to and from the vehicle. An example of such a rearview assembly is disclosed in commonly assigned U.S. Pat. No. 6,407,712, the entire disclosure of which is incorporated herein by reference.

As also described above, the rearview assembly may further include one or more of the same or different types of displays 36. Examples of different types of displays include vacuum fluorescent, LCD, reverse LCD, LED, organic LED, dot matrix, backlit indicia, etc. For displays intended to simultaneously display significant amounts of information, the display disclosed in commonly assigned U.S. Pat. No. 6,346,698 may be used, the entire disclosure of which is incorporated herein by reference. Examples of backlit indicia panel displays are disclosed in commonly assigned U.S. Pat. Nos. 6,170,956, 6,572,233, 6,870,655 and 6,356,376, the entire disclosures of which are incorporated herein by reference. Various displays used in rearview element are disclosed in commonly assigned U.S. Pat. Nos. 6,356,376 and 6,700,692, the entire disclosures of which are incorporated herein by reference.

The wiring for the vehicle accessories in the rearview assembly housing may be run through the mount and along the windshield (if the mount does not already extend to the headliner) under a channel mount. An example of a rearview assembly in which the wiring for accessories in the rearview assembly housing is routed through the mount is disclosed in commonly assigned U.S. Pat. No. 6,467,919, the entire disclosure of which is incorporated herein by reference.

While the present invention has been described as being implemented with the sensors positioned within the housing of a rearview assembly, the sensors could be mounted in the mounting foot or in any other location of the rearview assembly. Further still, any or all of the various components of the inventive electronic compass may be mounted elsewhere in the vehicle. It will be further appreciated that certain embodiments of the present invention are novel and useful in vehicles such as land-based vehicles (i.e., automobiles, trucks, sport utility vehicles (SUVs), trains, motorcycles, bicycles, mopeds, scooters, snowmobiles, all-terrain vehicles (ATVs), and military vehicles) as well as in other vehicles such as airplanes, marine vessels, and amphibious vehicles.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A rearview assembly comprising:
   a rearview element having a front surface and a rear surface;
   a crush bracket connected to the rear surface of the rearview element, the crush bracket including a support panel directly connected to the rear surface of the rearview element and at least two legs extending from the support panel in a direction opposite to the rearview element; and
   a mount interconnected to the at least two legs of the crush bracket;
   the at least two legs being configured to collapse in a direction between the rear surface of the rearview element and the mount as a striking force strikes the front surface of the rearview element.

2. The rearview assembly of claim 1, wherein:
   the rearview element comprises an electrochromic rearview element assembly including a front glass element and a rear glass element, with electrochromic material located between the front glass element and the rear glass element;
   the front surface is on the front glass element; and
   the rear surface is on the rear glass element.

3. The rearview assembly of claim 1, wherein:
   double-sided adhesive foam tape directly connects the support panel of the crush bracket to the rear surface of the rearview element.

4. The rearview assembly of claim 1, wherein: the rearview element has a portion of a circuit provided directly on the rear surface.

5. The rearview assembly of claim 1, further including:
   a printed circuit board connected to the crush bracket.

6. The rearview assembly of claim 1, further including:
   an electrical circuit including a heat emitting component;
   wherein the crush bracket includes a portion thereof contacting the heat emitting component to provide a heat sink for the heat emitting component.

7. The rearview assembly of claim 6, wherein:
   the portion of the crush bracket comprises resilient fingers resiliently pressed against the heat emitting component.

8. The rearview assembly of claim 6, wherein:
   the rearview element has at least a portion of the electrical circuit provided directly on the rear surface thereof; and
   the at least a portion of the electrical circuit includes the heat emitting component.

9. The rearview assembly of claim 1, further including:
   an electrical circuit including an electrically conductive component;
   wherein the crush bracket includes at least a portion thereof contacting the electrically conductive component to provide a ground for the electrically conductive component.

10. The rearview assembly of claim 9, wherein:
    the portion of the crush bracket comprises resilient fingers resiliently pressed against the electrically conductive component.

11. The rearview assembly of claim 9, wherein:
    the rearview element has at least a portion of the electrical circuit provided directly on the rear surface thereof; and
    the at least a portion of the electrical circuit includes the electrically conductive component.

12. The rearview assembly of claim 1, wherein:
    the crush bracket compresses at least 1.0 mm without breaking the rearview element as the front surface of the rearview element is subjected to a force no greater than 400 N (90 pounds) in any direction that is not more than 45° from a forward longitudinal direction of motion of a vehicle having the rearview assembly connected thereto.

13. The rearview assembly of claim 1, further including:
a housing having the rearview element therein;
wherein the rearview element does not contact the housing.

14. The rearview assembly of claim 1, further including:
a connection plate connected to the at least two legs of the crush bracket and the mount.

15. The rearview assembly of claim 14, wherein:
the mount includes a ball adapted to be received within the connection plate to interconnect the mount to the crush bracket.

16. The rearview assembly of claim 14, further including:
a first pivot ball connected to the connection plate and a sleeve connected to the first pivot ball;
wherein the mount includes a second pivot ball connected to the sleeve to interconnect the mount to the crush bracket.

17. The rearview assembly of claim 14, further including:
a housing having the rearview element, the crush bracket and the connection plate therein;
the housing being frictionally engaged between the mount and the connection plate.

18. The rearview assembly of claim 17, wherein:
the housing does not abut the rearview element.

19. The rearview assembly of claim 1, wherein:
the at least two legs include connection panels on ends thereof; and
the connection panels move towards the support panel as the at least two legs are collapsed in a direction between the rear surface of the rearview element and the mount.

20. The rearview assembly of claim 1, wherein: the at least two legs are two legs.

21. The rearview assembly of claim 1, wherein:
the at least two legs are each bowed outwardly.

22. The rearview assembly of claim 1, wherein:
the support panel is spilt and includes two separate portions.

23. The rearview assembly of claim 1, wherein:
the rearview element has a portion of a circuit provided directly on the rear surface thereof, the circuit including a glare sensor for measuring glare.

24. The rearview assembly of claim 23, wherein:
the rearview element comprises an electrochromic rearview element assembly including a front glass element and a rear glass element, with electrochromic material located between the front glass element and the rear glass element;
the front surface is on the front glass element;
the rear surface is on the rear glass element.

25. The rearview assembly of claim 24, wherein:
the electrochromic rearview element assembly darkens in response to the glare sensed by the glare sensor.

26. A rearview assembly comprising:
a rearview element having a front surface and a rear surface, the rearview element having a portion of a circuit provided directly on the rear surface;
a crush bracket connected to the rear surface of the rearview element, the crush bracket including at least two legs; and
a mount interconnected to the at least two legs of the crush bracket;
the at least two legs being configured to collapse in a direction between the rear surface of the rearview element and the mount as a striking force strikes the front surface of the rearview element.

27. The rearview assembly of claim 26, wherein:
the rearview element comprises an electrochromic rearview element assembly including a front glass element and a rear glass element, with electrochromic material located between the front glass element and the rear glass element;
the front surface is on the front glass element; and
the rear surface is on the rear glass element.

28. The rearview assembly of claim 26, wherein:
double-sided adhesive foam tape directly connects the crush bracket to the rear surface of the rearview element.

29. The rearview assembly of claim 26, wherein:
the circuit includes a heat emitting component; and
the crush bracket includes at least a portion thereof contacting the heat emitting component to provide a heat sink for the heat emitting component.

30. The rearview assembly of claim 29, wherein:
the portion of the crush bracket comprises resilient fingers resiliently pressed against the heat emitting component.

31. The rearview assembly of claim 26, further including:
the circuit includes an electrically conductive component; and
the crush bracket includes at least a portion thereof contacting the electrically conductive component to provide a ground for the electrically conductive component.

32. The rearview assembly of claim 31, wherein:
the portion of the crush bracket comprises resilient fingers resiliently pressed against the electrically conductive component.

33. The rearview assembly of claim 26, wherein:
the, crush bracket compresses at least 1.0 mm without breaking the rearview element as the front surface of the rearview element is subjected to a force no greater than 400 N (90 pounds) in any direction that is not more than 45° from a forward longitudinal direction of motion of a vehicle having the rearview assembly connected thereto.

34. The rearview assembly of claim 26, further including:
a housing having the rearview element therein;
wherein the rearview element does not contact the housing.

35. The rearview assembly of claim 26, further including:
a connection plate connected to the at least two legs of the crush bracket and the mount.

36. The rearview assembly of claim 35, wherein:
the mount includes a ball adapted to be received within the connection plate to interconnect the mount to the crush bracket.

37. The rearview assembly of claim 35, further including:
a first pivot ball connected to the connection plate and a sleeve connected to the first pivot ball;
wherein the mount includes a second pivot ball connected to the sleeve to interconnect the mount to the crush bracket.

38. The rearview assembly of claim 35, further including:
a housing having the rearview element, the crush bracket and the connection plate therein;
the housing being frictionally engaged between the mount and the connection plate.

39. The rearview assembly of claim 38, wherein:
the housing does not abut the rearview element.

40. The rearview assembly of claim 26, wherein:
the at least two legs include connection panels on ends thereof; and the connection panels move towards the rear surface of the rearview element as the at least two legs are collapsed in a direction between the rear surface of the rearview element and the mount.

41. The rearview assembly of claim 26, wherein:
the at least two legs are two legs.

42. The rearview assembly of claim 26, wherein:
the at least two legs are each bowed outwardly.

43. The rearview assembly of claim 26, wherein:
the crush bracket includes a support panel that is split and includes two separate portions.

44. The rearview assembly of claim 26, wherein:
the circuit includes a glare sensor for measuring glare.

45. The rearview assembly of claim 44, wherein:
the rearview element comprises an electrochromic rearview element assembly including
a front glass element and a rear glass element, with electrochromic material located between the front glass element and the rear glass element;
the front surface is on the front glass element;
the rear surface is on the rear glass element.

46. The rearview assembly of claim 45, wherein:
the electrochromic rearview element assembly darkens in response to the glare sensed by the glare sensor.

47. A rearview assembly comprising:
a rearview element having a front surface and a rear surface;
a support plate supporting the rearview element;
a crush bracket connected to the support plate, the crush bracket including a support panel connected to the support plate and at least two legs extending from the support panel; and
a mount interconnected to the at least two legs of the crush bracket;
the at least two legs being configured to collapse in a direction between the rear surface of the rearview element and the mount as a striking force strikes the front surface of the rearview element.

48. The rearview assembly of claim 47, wherein:
the rearview element comprises an electrochromic rearview element assembly including a front glass element and a rear glass element, with electrochromic material located between the front glass element and the rear glass element;
the front surface is on the front glass element; and
the rear surface is on the rear glass element.

49. The rearview assembly of claim 47, wherein:
double-sided adhesive foam tape directly connects the crush bracket to the support plate.

50. The rearview assembly of claim 47, wherein:
the rearview element has a portion of a circuit provided directly on the rear surface.

51. The rearview assembly of clam 47, further including:
a printed circuit board connected to the support plate.

52. The rearview assembly of claim 47, further including:
an electrical circuit including a heat emitting component;
wherein the crush bracket includes at least a portion thereof contacting the heat emitting component to provide a heat sink for the heat emitting component.

53. The rearview assembly of claim 47, further including:
an electrical circuit including an electrically conductive component;
wherein the crush bracket includes at least a portion thereof contacting the electrically conductive component to provide a ground for the electrically conductive component.

54. The rearview assembly of claim 47, wherein:
the crush bracket compresses at least 1.0 mm without breaking the rearview element as the front surface of the rearview element is subjected to a force no greater than 400 N (90 pounds) in any direction that is not more than 45° from a forward longitudinal direction of motion of a vehicle having the rearview assembly connected thereto.

55. The rearview assembly of claim 47, further including:
a connection plate connected to the at least two legs of the crush bracket and the mount.

56. The rearview assembly of claim 55, wherein:
the mount includes a ball adapted to be received within the connection plate to interconnect the mount to the crush bracket.

57. The rearview assembly of claim 55, further including:
a first pivot ball connected to the connection plate and a sleeve connected to the first pivot ball;
wherein the mount includes a second pivot ball connected to the sleeve to interconnect the mount to the crush bracket.

58. The rearview assembly of claim 55, further including:
a housing having the rearview element the crush bracket and the connection plate therein;
the housing being frictionally engaged between the mount and the connection plate.

59. The rearview assembly of claim 58, wherein:
the housing does not abut the rearview element.

60. The rearview assembly of claim 47, wherein:
the at least two legs include connection panels on ends thereof; and
the connection panels move towards the support panel as the at least two legs are collapsed in a direction between the rear surface of the rearview element and the mount.

61. The rearview assembly of claim 47, wherein:
the at least two legs are two legs.

62. The rearview assembly of claim 47, wherein;
the at least two legs are each bowed outwardly.

63. The rearview assembly of claim 47, wherein:
the support panel is split and includes two separate portions.

64. The rearview assembly of claim 47, further including:
a circuit board connected to the support plate, the circuit board having an opening therethrough;
wherein the crush bracket extends through the opening.

65. The rearview assembly of claim 64, wherein:
the circuit board includes a glare sensor thereon for measuring glare.

66. The rearview assembly of claim 65, wherein:
the rearview element comprises an electrochromic rearview element assembly including a front glass element and a rear glass element, with electrochromic material located between the front glass element and the rear glass element;
the front surface is on the front glass element;
the rear surface is on the rear glass element.

67. The rearview assembly of claim 66, wherein:
the electrochromic rearview element assembly darkens in response to the glare sensed by the glare sensor.

68. A rearview assembly comprising:
a rearview element;
a housing having the rearview element therein;
an electrical circuit in the housing, the electrical circuit including a heat emitting component; and
a crush bracket interconnected to the rearview element, the crush bracket including at least a portion thereof contacting the heat emitting component to provide a heat sink for the heat emitting component;

wherein the crush bracket is connected to a rear surface of the rearview element and the crush bracket includes at least two legs; and further including a mount interconnected to the at least two legs of the crush bracket;

wherein the at least two legs are configured to collapse in a direction between the rear surface of the rearview element and the mount as a striking force strikes the front surface of the rearview element.

69. The rearview assembly of claim 68, wherein:

the at least two legs include connection panels on ends thereof; and the connection panels move towards the rear surface of the rearview element as the at least two legs are collapsed in a direction between the rear surface of the rearview element and the mount.

70. A rearview assembly comprising:

a rearview element;

a rearview element housing having the rearview element therein;

an electrical circuit in the rearview element housing, the electrical circuit including an electrically conductive component; and a crush bracket interconnected to the rearview element, the crush bracket including at least a portion thereof contacting the electrically conductive component to provide a ground for the electrically conductive component;

wherein the crush bracket is connected to a rear surface of the rearview element and the crush bracket includes at least two legs; and further including a mount interconnected to the at least two legs of the crush bracket;

wherein the at least two legs are configured to collapse in a direction between the rear surface of the rearview element and the mount as a striking force strikes the front surface of the rearview element.

71. The rearview assembly of claim 70, wherein:

the at least two legs include connection panels on ends thereof; and the connection panels move towards the rear surface of the rearview element as the at least two legs are collapsed in a direction between the rear surface of the rearview element and the mount.

72. A rearview assembly for a vehicle comprising:

a rearview element having a reflective surface;

a rearview element housing having at least a portion of the rearview element therein; and a mount for connecting the rearview element and the rearview element housing to a windshield of the vehicle;

wherein a portion of the rearview assembly non-elastically compresses at least 1.0 mm without breaking the rearview element as the reflective surface of the rearview element is subjected to a force no greater than 400 N (90 pounds) in any direction that is not more than 45° from a forward longitudinal direction of motion of the vehicle.

73. The rearview assembly of claim 72, wherein:

the rearview element includes a front surface and a rear surface; and the portion of the rearview assembly comprises a crush bracket connected to the rear surface of the rearview element, the crush bracket including a support panel directly connected to the rear surface of the rearview element and at least two legs extending from the support panel in a direction opposite the rearview element;

the mount is interconnected to the at least two legs of the crush bracket; and the at least two legs are configured to collapse in a direction between the rear surface of the rearview element and the mount as a striking force strikes the front surface of the rearview element.

74. The rearview assembly of claim 73, wherein:

the at least two legs include connection panels on ends thereof; and the connection panels move towards the support panel as the at least two legs are collapsed in a direction between the rear surface of the rearview element and the mount.

75. The rearview assembly of claim 73, wherein:

the at least two legs are two legs.

76. The rearview assembly of claim 73, wherein:

the at least two legs are each bowed outwardly.

77. The rearview assembly of claim 73, further including:

an electrical circuit in the rearview element housing, the electrical circuit including a heat emitting component;

wherein the crush bracket includes a portion thereof contacting the heat emitting component to provide a heat sink for the heat emitting component.

78. The rearview assembly of claim 77, wherein:

the portion of the crush bracket comprises resilient fingers resiliently pressed against the heat emitting component.

79. The rearview assembly of claim 77, wherein:

the rearview element has at least a portion of the electrical circuit provided directly on the rear surface thereof; and the at least a portion of the electrical circuit includes the heat emitting component.

80. The rearview assembly of claim 73, further including:

an electrical circuit in the rearview element housing, the electrical circuit including an electrically conductive component;

wherein the crush bracket includes at least a portion thereof contacting the electrically conductive component to provide a ground for the electrically conductive component.

81. The rearview assembly of claim 80, wherein:

the portion of the crush bracket comprises resilient fingers resiliently pressed against the electrically conductive component.

82. The rearview assembly of claim 80, wherein:

the rearview element has at least a portion of the electrical circuit provided directly on the rear surface thereof; and the at least a portion of the electrical circuit includes the electrically conductive component.

83. The rearview assembly of claim 73, further including:

a connection plate connected to the at least two legs of the crush bracket and the mount.

84. The rearview assembly of claim 83, wherein:

the mount includes a ball adapted to be received within the connection plate to thereby interconnect the mount to the crush bracket.

85. The rearview assembly of claim 83, further including:

a first pivot ball connected to the connection plate and a sleeve connected to the first pivot ball;

wherein the mount includes a second pivot ball connected to the sleeve to interconnect the mount to the crush bracket.

86. The rearview assembly of claim 83, wherein:

the rearview element housing has the rearview element, the crush bracket and the connection plate therein; and the rearview element housing is frictionally engaged between the mount and the connection plate.

87. The rearview assembly of claim 86, wherein:

the rearview element housing does not abut the rearview element.

88. The rearview assembly of claim 72, wherein:

the rearview element has a from surface and a rear surface;

a support plate supports the rearview element;

the portion of the rearview assembly comprises a crush bracket connected to the support plate, the crush bracket including a support panel connected to the support plate and at least two legs extending from the support panel;

the mount is interconnected to the at least two legs of the crush bracket; and the at least two legs are configured to collapse in a direction between the rear surface of the rearview element and the mount as a striking force strikes the front surface of the rearview element.

89. The rearview assembly of claim 72, wherein:

the rearview element comprises an electrochromic rearview assembly including a front glass element and a rear glass element, with electrochromic material located between the front glass element and the rear glass element.

90. The rearview assembly of claim 72, wherein:

the portion of the rearview assembly comprises a crush bracket interconnected to the rearview element; and double-sided adhesive foam tape directly connects to the crush bracket to a rear surface of the rearview element.

91. The rearview assembly of claim 72, wherein:

the rearview element has a portion of a circuit provided directly on a rear surface thereof.

92. The rearview assembly of claim 72, wherein: the rearview element does not contact the rearview element housing.

* * * * *

UNITED STATES PATENT AND TRADEMARK OFFICE
CERTIFICATE OF CORRECTION

PATENT NO. : 7,196,836 B2
APPLICATION NO. : 10/985857
DATED : March 27, 2007
INVENTOR(S) : Frederick T. Bauer et al.

It is certified that error appears in the above-identified patent and that said Letters Patent is hereby corrected as shown below:

Column 37, Claim 51, Line 54;
   "clam 47" should be -- claim 47--.
Column 41, Claim 88, Line 7;
   "from" should be -- front--.
Column 42, Claim 90, Line 10;
   Delete "to" ($1^{st}$ occurrence).

Signed and Sealed this

Fourth Day of September, 2007

JON W. DUDAS
*Director of the United States Patent and Trademark Office*